(12) United States Patent
Kusunoki

(10) Patent No.: US 8,390,069 B2
(45) Date of Patent: Mar. 5, 2013

(54) SEMICONDUCTOR DEVICE

(75) Inventor: Shigeru Kusunoki, Tokyo (JP)

(73) Assignee: Mitsubishi Electric Corporation (JP)

( * ) Notice: Subject to any disclaimer, the term of this patent is extended or adjusted under 35 U.S.C. 154(b) by 378 days.

(21) Appl. No.: 12/436,453

(22) Filed: May 6, 2009

(65) Prior Publication Data

US 2010/0118455 A1 May 13, 2010

(30) Foreign Application Priority Data

Nov. 13, 2008 (JP) ................................ 2008-291327

(51) Int. Cl.
*H01L 27/088* (2006.01)
(52) U.S. Cl. ............ 257/360; 257/E27.06; 257/E27.071
(58) Field of Classification Search .................. 257/360, 257/487, E27.06, E27.071; 361/56
See application file for complete search history.

(56) References Cited

U.S. PATENT DOCUMENTS

| | | | |
|---|---|---|---|
| 3,940,785 A * | 2/1976 | Genesi | 257/477 |
| 5,196,354 A | 3/1993 | Ohtaka et al. | |
| 5,418,185 A * | 5/1995 | Todd et al. | 438/384 |
| 5,432,371 A * | 7/1995 | Denner et al. | 257/409 |
| 5,723,882 A * | 3/1998 | Okabe et al. | 257/139 |
| 6,028,341 A | 2/2000 | Tai et al. | |
| 6,603,185 B1 | 8/2003 | Jimbo et al. | |
| 6,828,645 B2 | 12/2004 | Jimbo et al. | |
| 2001/0048122 A1 | 12/2001 | Tada et al. | |
| 2007/0072332 A1* | 3/2007 | Kemmer | 438/56 |
| 2007/0215898 A1 | 9/2007 | Ozeki et al. | |
| 2007/0278672 A1 | 12/2007 | Tooi et al. | |

FOREIGN PATENT DOCUMENTS

| | | |
|---|---|---|
| JP | 4-768 | 1/1992 |
| JP | 4-212468 | 8/1992 |
| JP | 4-332173 | 11/1992 |
| JP | 6-338512 | 12/1994 |
| JP | 6-338514 | 12/1994 |
| JP | 7-326743 | 12/1995 |
| JP | 11-145466 | 5/1999 |
| JP | 11-330456 | 11/1999 |
| JP | 2000-269520 | 9/2000 |
| JP | 2000-294803 A | 10/2000 |
| JP | 2001-044431 A | 2/2001 |
| JP | 2005-217152 | 8/2005 |
| JP | 2006-173437 | 6/2006 |
| JP | 2006-269633 A | 10/2006 |
| JP | 2007-324261 A | 12/2007 |

OTHER PUBLICATIONS

Chinese Office Action dated Apr. 8, 2011; Chinese Patent Application No. 200910151664.7.
Japanese Office Action "Notice of Reason for Rejection" dated Jul. 3, 2012; Japanese Patent Application No. 2008-291327; with translation.
German Office Action; DE102009032446.1; Jun. 14, 2012 with English translation.

\* cited by examiner

*Primary Examiner* — Calvin Lee
*Assistant Examiner* — Monica D Harrison
(74) *Attorney, Agent, or Firm* — Studebaker & Brackett PC; Donald R. Studebaker

(57) ABSTRACT

A semiconductor device includes a semiconductor substrate including a semiconductor layer, a power device formed in the semiconductor substrate, a plurality of concentric guard rings formed in the semiconductor substrate and surrounding the power device, and voltage applying means for applying successively higher voltages respectively to the plurality of concentric guard rings, with the outermost concentric guard ring having the highest voltage applied thereto.

7 Claims, 20 Drawing Sheets symmetrical axis

SEMICONDUCTOR DEVICE

BACKGROUND OF THE INVENTION

1. Field of the Invention

The present invention relates to semiconductor devices having therein a power semiconductor device such as an IGBT (Insulated Gate Bipolar Transistor) or a power MOSFET, and more particularly to such semiconductor devices with enhanced dielectric strength and short circuit protection capability.

2. Background Art

Enhanced dielectric strength and short circuit protection capability are required of semiconductor devices incorporating a power semiconductor device (or simply "power device") which has a high voltage applied between its main electrodes. More specifically, such semiconductor devices must have a high dielectric strength and sufficient short circuit capability such that even if the load circuit connected between the main electrodes is short circuited, the power device does not degrade within a specified time period.

It is common for these semiconductor devices to include structures such as guard rings or field plates to increase the dielectric strength of the power device. A guard ring is, for example, a P-type region of an annular shape formed within an N-type substrate and surrounding the device region of the substrate in which the power device is formed. (Thus, the guard ring forms a PN junction with the substrate.) A plurality of guard rings are concentrically arranged to form a dielectric strength enhancing region. The guard rings function to reduce the electric field in the semiconductor layer of the semiconductor device in a known manner.

A field plate is an electrode disposed in an insulating film on the substrate surface of a power device between its gate and drain electrodes. It is common that a voltage approximately equal to the gate voltage is applied to the field plates of the power device. With this, the field plates function to reduce the electric field in the semiconductor layer of the semiconductor device in a known manner. Thus, guard rings and field plates are used to enhance the dielectric strength of semiconductor devices.

On the other hand, in order to improve the short circuit capability of a power device, its on-resistance may be increased to prevent a large current from flowing when a high voltage is applied between the main electrodes of the device. Other prior art techniques for enhancement of dielectric strength and short circuit protection are disclosed in the following patent publications.

Usually guard rings as described above are not connected to any source of potential, i.e., they are at a floating potential. Therefore, the electric field in the device tends to be stronger on the device region side (or inner side) of the device and weaker on its peripheral side. It has been found that this may result in the disadvantage that the depletion layer formed in the semiconductor layer in the device region does not extend a sufficient distance, preventing the device from having the desired dielectric strength. In such a case, it is necessary to increase the area of the dielectric strength enhancing region in order to enhance the dielectric strength. The use of field plates has also been found disadvantageous in that it may not sufficiently increase the dielectric strength of the device and may prevent miniaturization of the chip.

On the other hand, increasing the on-resistance of the power device to enhance its short circuit capability is accompanied by degradation of the electrical characteristics and performance of the device. That is, increasing the on-resistance makes it difficult to reduce the power consumption and increase the output power of the power device.

SUMMARY OF THE INVENTION

The present invention has been made to solve the above problems. It is, therefore, an object of the present invention to provide a semiconductor device which has sufficient dielectric strength and enhanced short circuit capability without increasing the area of the dielectric strength enhancing region.

According to one aspect of the present invention, a semiconductor device includes a semiconductor substrate including a semiconductor layer, a power device formed in the semiconductor substrate, a plurality of concentric guard rings formed in the semiconductor substrate and surrounding the power device, and voltage applying means for applying successively higher voltages respectively to the plurality of concentric guard rings, with the outermost concentric guard ring having the highest voltage applied thereto.

According to another aspect of the present invention, a semiconductor device includes a semiconductor layer, a gate electrode formed on the semiconductor layer, a drain electrode formed on the semiconductor layer, a source electrode formed on the semiconductor layer, an insulating film formed on the semiconductor layer between the gate electrode and the drain electrode, a plurality of intra-insulating film electrodes formed in the insulating film, and voltage applying means for applying successively higher voltages respectively to the plurality of intra-insulating film electrodes as the plurality of intra-insulating film electrodes are located closer to the drain electrode.

According to another aspect of the present invention, a semiconductor device includes a power device including a semiconductor layer, a gate electrode, a drain electrode, and a source electrode that are all formed on a surface of the power device, a burying insulating film formed in the semiconductor layer, a plurality of intra-insulating film electrodes formed in the burying insulating film between the drain electrode and the gate electrode, and voltage applying means for applying successively higher voltages respectively to the plurality of intra-insulating film electrodes as the plurality of intra-insulating film electrodes are located closer to the drain electrode.

According to another aspect of the present invention, a semiconductor device includes a semiconductor layer, a gate electrode form in a top surface of the semiconductor layer, an emitter electrode formed on the top surface of the semiconductor layer, a collector electrode formed on a bottom surface of the semiconductor layer, a gate wire for supplying a gate drive signal to the gate electrode, a delay circuit for delaying the gate drive signal, and grounding means for receiving an output voltage of the delay circuit and a voltage on the semiconductor layer and, if the output voltage of the delay circuit and the voltage on the collector electrode are both at a high level, grounding the gate wire.

According to another aspect of the present invention, a semiconductor device includes a semiconductor layer, a gate electrode, a drain electrode, and a source electrode that are all formed on a surface of the semiconductor layer, a gate wire for supplying a gate drive signal to the gate electrode, a delay circuit for delaying the gate drive signal, and grounding means for receiving an output voltage of the delay circuit and the voltage on the drain electrode and, if the output voltage of the delay circuit and the voltage on the drain electrode are both at a high level, grounding the gate wire.

According to another aspect of the present invention, a semiconductor device includes a semiconductor layer, a power device including a first gate electrode, a second gate electrode, an emitter electrode, and a collector electrode, the first and second gate electrodes and the emitter electrode being formed on a top surface of the semiconductor layer, the collector electrode being formed on a bottom surface of the semiconductor layer, and a gate wire for supplying a gate drive signal to the first gate electrode, and supply means for supplying the gate drive signal to the second gate electrode when the gate drive signal is at a high level and a voltage on the semiconductor layer is at a low level.

Other and further objects, features and advantages of the invention will appear more fully from the following description.

DETAILED DESCRIPTION OF THE PREFERRED EMBODIMENTS

First Embodiment

Figure 1:
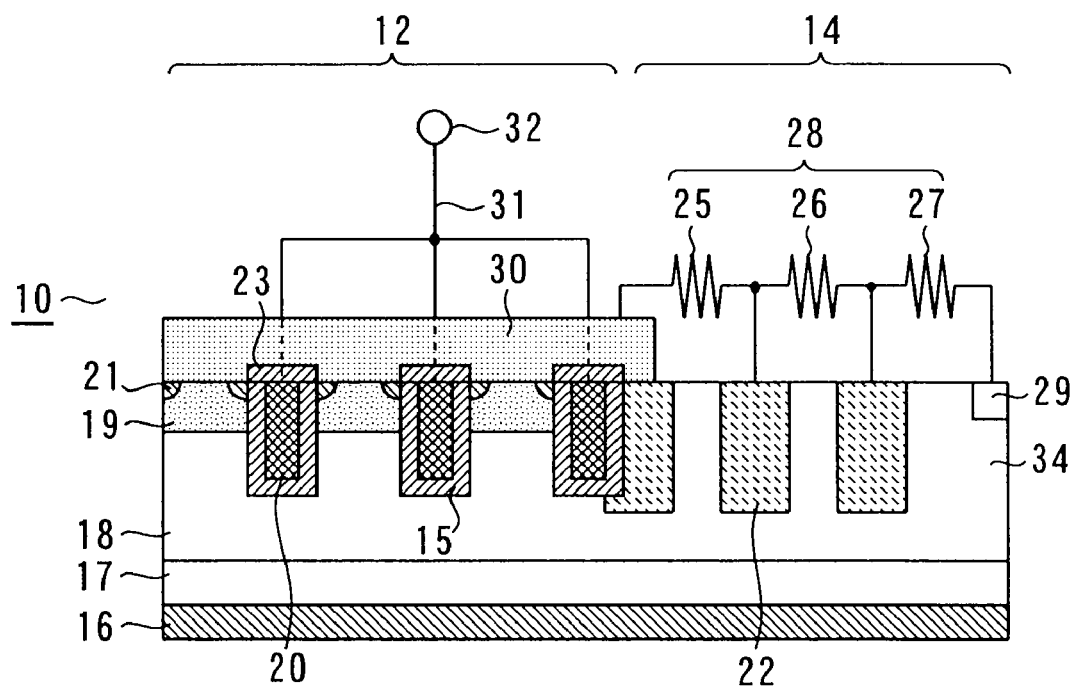
FIG. 1 shows semiconductor device of first embodiment.

A first embodiment of the present invention relates to a semiconductor device with guard rings formed therein. This embodiment will be described in detail with reference to FIGS. 1 to 6. FIG. 6 is a cross-sectional view with a partial schematic, showing a semiconductor device 10 of the present embodiment. This semiconductor device 10 is formed from a single semiconductor substrate or chip, and includes a device region 12 in which a power device is formed, and a dielectric strength enhancing region 14 located around the device region 12. According to the present embodiment, the power device is a vertical IGBT which includes a plurality of integrated cells. In this example, the IGBT cells are of a trench type. However, they may be of a planar type.

The device region 12 and the dielectric strength enhancing region 14 are formed in the same semiconductor layer 18, which is an n layer. When the IGBT in the device region 12 is turned on, the semiconductor layer 18 receives carriers from the collector and emitter sides (described later) and thereby undergoes conductivity modulation.

The following description will be directed to the device region 12 formed in the semiconductor layer 18. A p-base layer 19 is formed in the surface of the semiconductor layer 18 in the device region 12, and a plurality of trenches extend from the top surface of the p-base layer 19 into the n⁻ layer (i.e., semiconductor layer 18). Each trench is coated on its interior walls with a gate insulating film 15 and filled with a polysilicon plug, which forms a gate electrode 20. An insulating film 23 covers the top surface of each gate electrode 20. These gate electrodes 20 are connected to a gate terminal (or gate bonding pad) 32 by a gate wire 31 so that a gate drive signal can be applied to the gate electrodes 20 through the gate terminal 32.

Further, n+ emitter regions 21 are formed in the surfaces of the p-base layer 19 in contact with the gate insulating films 15. An emitter electrode 30 of aluminum, etc. covers the surface of the device region 12. It covers and is in contact with the top surfaces of n⁺ emitter regions 21 and the p-base layer 19. As can be seen from FIG. 1, when a gate drive signal for turning on the IGBT is applied to the gate electrodes 20, the conductivity type of the surfaces of the p-base layer 19 in contact with the gate insulating films is reversed, thereby forming a carrier path or channel between the semiconductor layer 18 and the emitter electrode 30 (or emitter regions 21). This operation is the same as that of any ordinary IGBT.

Further, a p⁺ collector layer 17, which serves as a collector, is formed on the bottom surface of the semiconductor layer 18, and a collector electrode 16 is formed on the p⁺ collector layer 17. According to the present embodiment, the collector electrode 16 extends over the dielectric strength enhancing region 14 as well as over the device region 12.

The following description will be directed to the dielectric strength enhancing region 14 in the semiconductor device 10 of the present embodiment. A plurality of guard rings 22 are formed in the dielectric strength enhancing region 14. They are regions of opposite conductivity type to the semiconductor layer 18; in the present embodiment they are p⁺ regions. These guard rings 22 are concentrically arranged around the device region 12.

The emitter electrode 30 is connected to a peripheral portion 34 of the semiconductor layer 18 outside the guard rings 22 by a high resistance element (wire or strip) 28. Typically, the peripheral portion 34 has an $n^+$ channel stopper region 29 (of the same conductivity type as the semiconductor layer 18) formed therein, and the high resistance element 28 is connected to this region 29.

The high resistance element 28 is electrically divided into a plurality of sections or resistance elements to provide the desired voltages. Specifically, in this example, the high resistance element 28 is made up of a resistance element 25, a resistance element 26, and a resistance element 27 connected in series. The resistance element 27, which is the outermost one of the three, is connected at one end to the peripheral portion 34 and at the other end to one end of the resistance element 26. The other end of the resistance element 26 is connected to one end of the resistance element 25, and the other end of the resistance element 25 is connected to the emitter electrode 30. The resistance value of the high resistance element 28 may be determined by the maximum collector-to-emitter voltage rating and leakage current rating of the semiconductor device. For example, when the maximum collector-to-emitter voltage rating is 600 V, an appropriate value for the high resistance element 28 is approximately 600 MΩ.

According to the present embodiment, the junction between the resistance elements 27 and 26 is connected to the outermost guard ring (closest to the peripheral portion 34) by an electrical wire. Further, the junction between the resistance elements 26 and 25 is connected to the middle guard ring (spaced apart from the peripheral portion 34) by an electrical wire.

It will be noted that the semiconductor layer 18 is at approximately the same voltage as that applied to the collector electrode 16. That is, for example, when the voltage on the emitter electrode 30 is 0 V and the voltage on the collector electrode 16 is 600 V, a high voltage of approximately 600 V is applied to the peripheral portion 34. This voltage (approximately 600 V) is divided by the resistance elements 25 to 27 of the high resistance element 28 connected between the emitter electrode 30 and the channel stopper region 29 in the peripheral portion 34 as described above. As a result, the voltages of the guard rings 22, which are connected to these resistance elements, increase as they are located closer to the peripheral portion 34. That is, guard rings 22 that are closer to the peripheral portion 34 have a higher voltage applied thereto. Thus the high resistance element 28 serves as voltage applying means (or voltage divider) for applying voltages to the guard rings 22. It should be noted that the term "voltage applying means" as used herein is not limited to means for applying voltages to guard rings, but include any means for applying voltages in order to enhance the dielectric strength of a semiconductor device.

The semiconductor device 10 will be further described with reference to FIG. 2, which is a plan view thereof. In FIG. 2 those components common to FIG. 1 retain the same reference numerals and will not be further described. Further, although in FIG. 1 the high resistance element 28 is represented by a circuit diagram, in FIG. 2 it is shown in plan view. It should be noted that it is common that conductive patterns of aluminum, etc. are formed over and electrically connected to the top surfaces of the guard rings 22 and the channel stopper region 29 in order to stabilize their potentials. These conductive patterns are omitted from FIG. 2 for convenience of illustration.

The high resistance element 28 of the present embodiment is a single spiral strip of polysilicon connected at one end to the peripheral portion 34 and at the other end to the emitter electrode 30, as shown in FIG. 2. More specifically, the high resistance element 28 is connected to the channel stopper region 29 of the peripheral 34 by a contact 33, and connected to the guard rings 22 by contacts 35. To better understand the structures of the contact 33 and the contacts 35, it will be helpful to refer to FIG. 3, which is an enlarged cross-sectional view of a portion of the semiconductor device. A conductive pattern 42 of aluminum, etc. covers the channel stopper region 29 and is electrically connected thereto by the contact 33 in order to stabilize the potential of the region. Likewise, conductive patterns 40 of aluminum, etc. cover their respective guard rings and are electrically connected thereto by the respective contacts 35 in order to stabilize the potentials of the guard rings. Although in FIG. 2 the high resistance element 28 is electrically connected to the guard rings 22 and the channel stopper region 29 through the conductive patterns 40 and 42, respectively, it is to be understood that the element 28 may be directly connected to these components. It should be noted that the contact 37 shown in FIG. 2 connects between the high resistance element 28 and the emitter electrode 30.

This completes the description of the configuration of the semiconductor device 10 of the present embodiment. As described above, in the semiconductor device of the present embodiment, a voltage derived from the voltage on the collector electrode 16 is divided by the resistance elements of the high resistance element 28 to produce a plurality of voltages which are then applied to the guard rings 22 so that the outer guard rings 22 receive a higher voltage than the inner guard rings 22. This causes the depletion layer formed in the device region 12 of the semiconductor layer 18 to extend toward the outer sides of the guard rings, resulting in improved uniformity of the electric field intensity in the semiconductor layer 18 and resulting in enhanced dielectric strength of the device.

Further, the voltages applied to the guard rings 22 can be adjusted by varying the resistance value and division ratio of the high resistance element 28 (serving as a voltage divider). (The voltages or potentials applied to the guard rings 22 may be hereinafter referred to as "midpoint potentials," since they are intermediate between the potential of the collector electrode 16 and that of the emitter electrode 30.) The value of the high resistance element 28 may be adjusted such that the depletion layer formed in the device region 12 extends toward the outer sides of the guard rings 22, and appropriate midpoint potentials may be applied to the guard rings 22 to make the electric field in the dielectric strength enhancing region uniform. This enhances the dielectric strength of the semiconductor device 10, eliminating the need to increase the area of the dielectric strength enhancing region 14 in order to enhance the dielectric strength.

The high resistance element 28 is relatively long, since it has a spiral configuration, as described above with reference to FIG. 2. Therefore, the high resistance element 28 can be made of a material having a low resistivity, meaning that it is possible to increase the impurity concentration of the polysilicon material used to form the element. This reduces variations in the resistance of the high resistance element 28, allowing accurate and stable voltages to be supplied to the guard rings 22. Further, since the high resistance element 28 has a spiral shape, each guard ring 22 can be connected thereto at any desired position, thus allowing the voltage on the guard ring to be adjusted over a wide range.

Figure 4:
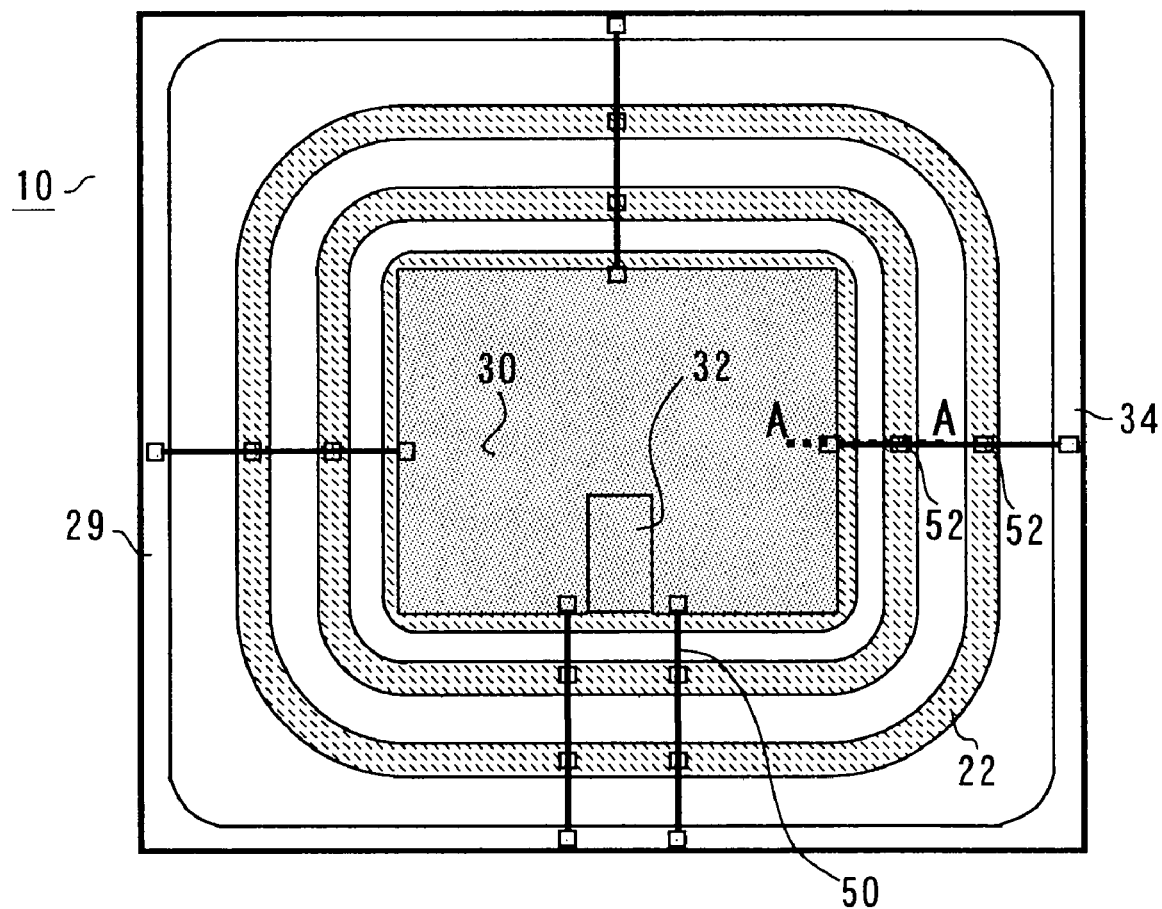
FIG. 4 shows a linear resistance element.

Although in the present embodiment the high resistance element 28 has a spiral shape as shown in FIG. 2, it is to be understood that in other embodiments it may have a different shape. For example, the high resistance element 28 may have a configuration such as that shown in FIG. 4 or 5. The resistance elements 50 shown in FIG. 4 are linear strips connected between the emitter electrode 30 and the peripheral portion 34 of the semiconductor layer. Guard rings 22 and contacts 52 are so formed between the emitter electrode 30 and the peripheral portion 34 as to divide the length of each resistance element 50 into equal parts. As a result, the voltages applied to the guard rings 22 linearly decrease as a function of the distance from the peripheral portion 34, making the electric field in the semiconductor layer uniform. Further, appropriate voltages can be applied to the guard rings 22 to enhance the dielectric strength of the semiconductor device. This allows the area of the dielectric strength enhancing region 14 to be reduced.

Figure 5:
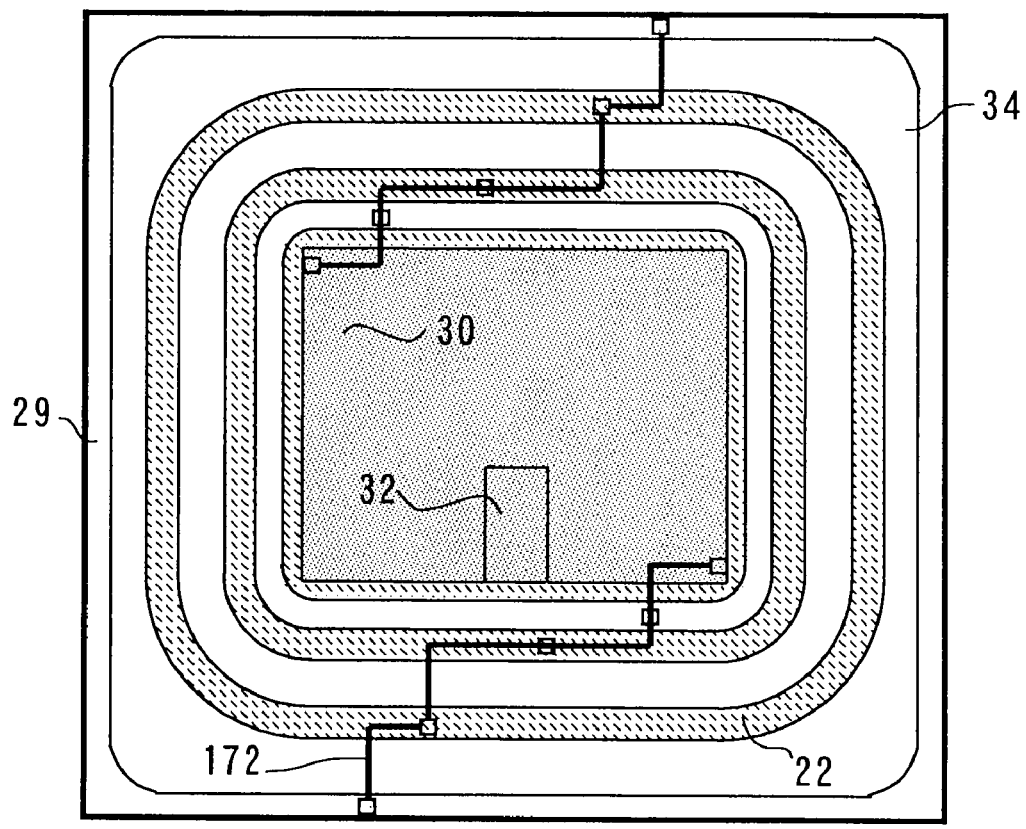
FIG. 5 shows a stepped resistance element.
Figure 6:
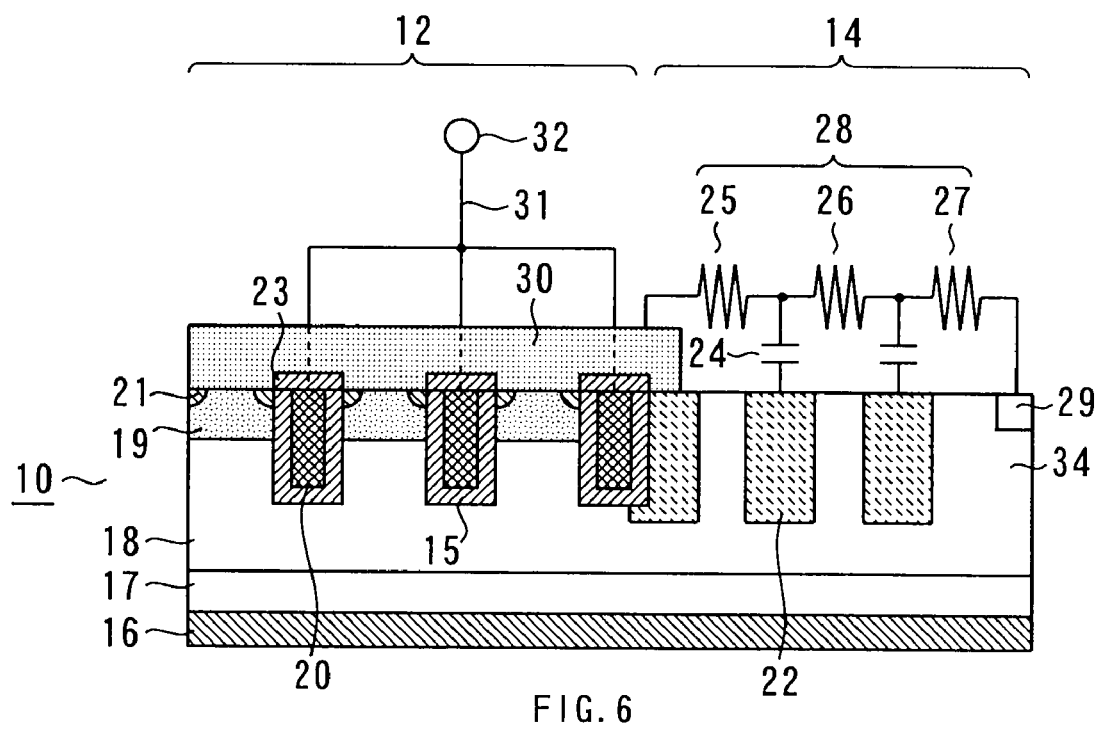
FIG. 6 shows a resistance element connected to the guard rings by capacitors.

The resistance elements 60 shown in FIG. 5 are stepped (or zigzag) strips connected between the emitter electrode 30 and the peripheral portion 34. The configuration of each resistance element 60 is such that the voltages applied to the guard rings 22 linearly decrease as a function of the distance from the peripheral portion 34. Since each resistance element 60 has a stepped (or zigzag) configuration, it is longer than the resistance elements 50 of FIG. 5. This means that the resistance elements 60 can be made of a polysilicon having a relatively low resistivity in order to stabilize the voltages applied to the guard rings 22.

Although in the present embodiment the high resistance element 28 (including the resistance elements 25 to 27) is electrically connected to the guard rings 22 by the contacts 35, it is to be understood that the present invention is not limited to this particular arrangement. In other embodiments, for example, the resistance elements (25 to 27) may be connected to the guard rings by capacitors 24, as shown in FIG. 6. This arrangement also ensures that the outer guard rings 22 receive a higher voltage than the inner guard rings 22, resulting in the same advantages as described above in connection with the present embodiment. It should be further noted that the resistance elements (25 to 27) may be connected to the guard rings 22 by parasitic capacitances instead of the capacitors 24 formed around the contacts.

Figure 7:
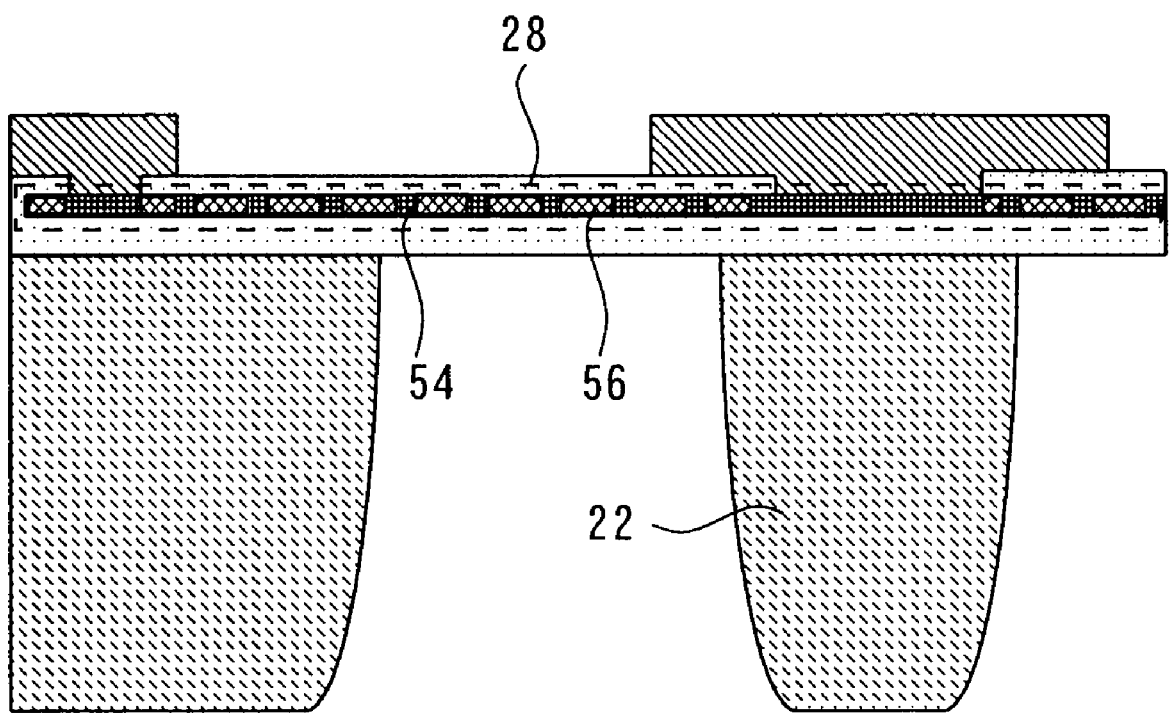
FIG. 7 is a cross-sectional view taken along line A-A of FIG. 4.

Thus, the shape and position of the high resistance element 28 and material of which it is made may be altered in various ways without departing from the scope of the present invention. Another variation of the present embodiment will be described with reference to FIG. 7. FIG. 7 is a cross-sectional view taken along line A-A of FIG. 4. In this variation, the high resistance element 28 includes pluralities of alternating N-type semiconductor regions 54 and P-type semiconductor regions 56 arranged in the length direction of the element 28. The N-type semiconductor regions 54 and the P-type semiconductor regions 56 form diodes having a relatively low breakdown voltage. The pitch of these diodes may be changed to adjust the voltages applied to the guard rings 22. That is, since the high resistance element 28 includes these diodes, the voltages applied to the guard rings 22 can be adjusted by varying the pitch of the diodes as well as by varying the length of the element 28 (as described above), i.e., the voltages can be varied over a wider range.

Further, although in the present embodiment the high resistance element 28 receives a voltage from the peripheral portion 34, it is to be understood that in other embodiments the high resistance element 28 may be connected to an external power supply.

Second Embodiment

Figure 8:
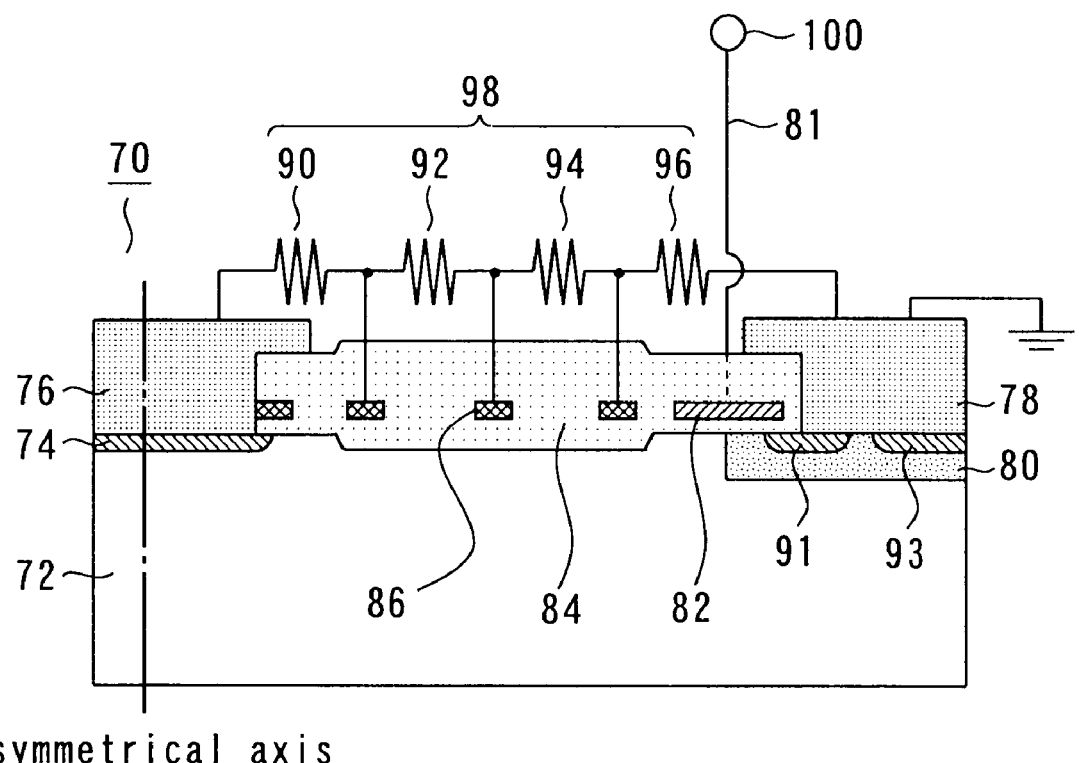
FIG. 8 is a cross-sectional view with a partial schematic of semiconductor device of second embodiment.

A second embodiment of the present invention relates to a semiconductor device having a lateral MOSFET (a power device) therein. This embodiment will be described in detail with reference to FIGS. 8 to 11. FIG. 8 is a cross-sectional view with a partial schematic, showing a semiconductor device 70 of the present embodiment. This semiconductor device 70, which includes a lateral MOSFET, is formed from a semiconductor substrate and includes a semiconductor layer 72. The semiconductor layer 72 is an n⁻ layer and has an n⁺ drain 74 formed in its surface. A drain electrode 76 of aluminum, etc. covers and is in electrical contact with the drain 74. Further, a p-base region 80 is formed in the surface of the semiconductor layer 72 and spaced from the n⁺ drain 74. An n⁺ source 91 and a p⁺ region 93 are formed in the surface of the p-base region 80, and a grounded source electrode 78 of aluminum, etc. covers and is in electrical contact with the source 91 and the p⁺ region 93.

An insulating film 84 is formed on the surface of the semiconductor substrate between the source electrode 78 (or n⁺ source 91) and the drain electrode 76 (or n⁺ drain 74). It should be noted that although the insulating film 84 is composed of a plurality of insulating film layers, these layers are not shown in FIG. 8 for convenience of illustration. A gate electrode 82 of polysilicon is formed in the insulating film 84 above the p-base region 80. The gate electrode 82 is connected to a gate terminal 100 by a gate wire 81 and receives a gate drive signal from the gate terminal 100. When a gate drive signal for turning on the MOSFET is applied to the gate electrode 82, a channel is formed in the surface portion of the p-base region 80 facing the gate electrode 82.

Since lateral MOSFETs must have a high dielectric strength, the semiconductor device 70 of the present embodiment further includes a plurality of intra-insulating film electrodes 86 formed in the insulating film 84. The intra-insulating film electrodes 86 are made of the same polysilicon material as the gate electrode 82. Such electrodes are sometimes referred to as "field plates." The intra-insulating film electrodes 86 serves to reduce the electric field in the semiconductor layer 72 of the lateral MOSFET, as is known in the art. The semiconductor device 70 of the present embodiment also includes a high resistance element 98 connected at one end to the drain electrode 76 and at the other end to the source electrode 78. The high resistance element 98 is electrically divided into a plurality of sections or resistance elements. Specifically, in this example, the high resistance element 98 is made up of resistance elements 90, 92, 94, and 96 connected in series. One end of the resistance element 90 is connected to the drain electrode 76, and the other end of resistance element 90 is connected to one end of the resistance element 92. The other end of the resistance element 92 is connected to one end of the resistance element 94. The other end resistance element 94 is connected to one end of the resistance element 96, and the other end of the resistance element 96 is connected to the source electrode 78. Each resistance element is connected to a respective intra-insulating film electrode 86; specifically, the resistance element closest to the drain electrode 76 is connected to the intra-insulating film electrode 86 closest to the drain electrode 76, the second closest resistance element is connected to the second closest intra-insulating film 86, and so on.

Figure 9:
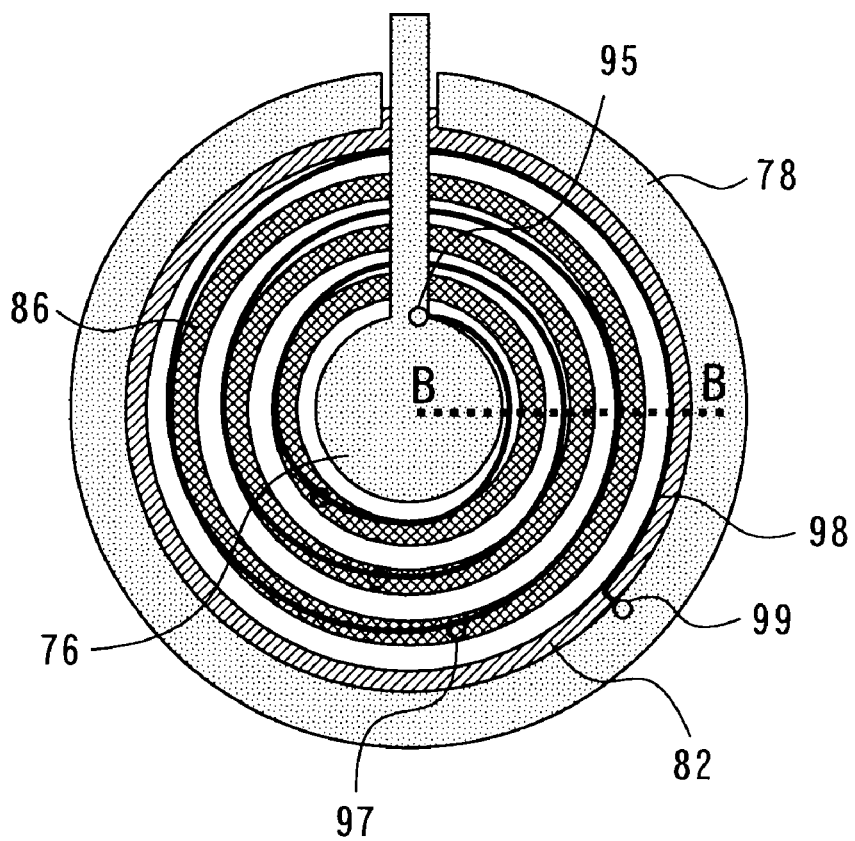
FIG. 9 shows a plan view of semiconductor device of second embodiment.
Figure 10:
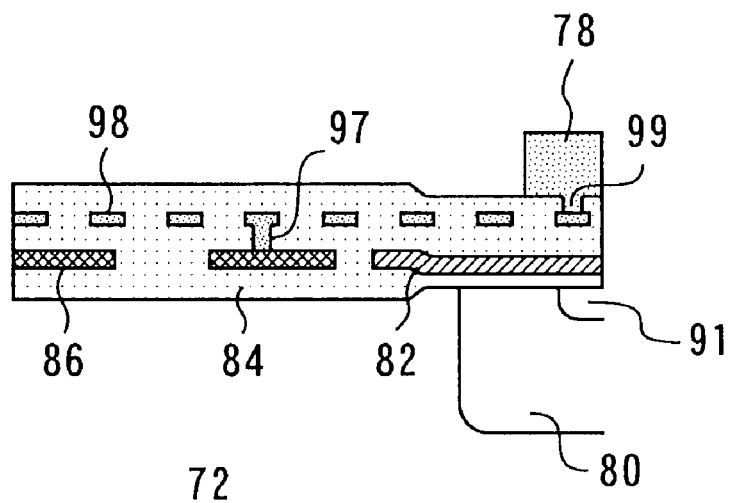
FIG. 10 is an enlarged cross-sectional view of a portion of the semiconductor device.

The semiconductor device 70 will be further described with reference to FIG. 9, which is a plan view thereof. In FIG. 9 those components common to FIG. 8 retain the same reference numerals and will not be further described. It will be noted that FIG. 8 described above is a cross-sectional view taken along line B-B of FIG. 9. Further, although in FIG. 8 the high resistance element 98 is represented by a circuit diagram, in FIG. 9 it is shown in plan view. In the lateral MOSFET of FIG. 8, the intra-insulating film electrodes 86, the gate electrode 82, and the source electrode 78 are concentrically arranged around the drain electrode 76, as shown in FIG. 9.

The high resistance element 98 of the present embodiment is a single spiral strip of polysilicon connected at one end to the source electrode 78 and at the other end to the drain electrode 76, as shown in FIG. 9. More specifically, the high resistance element 98 is connected to the source electrode 78 by a contact 99, and connected to the intra-insulating film electrodes 86 by contacts 97. To better understand the structures of the contact 99 and the contacts 97, it will be helpful to refer to FIG. 10, which is an enlarged cross-sectional view of a portion of the semiconductor device. It should be noted that the contact 95 connects between the high resistance element 98 and the drain electrode 76.

In the semiconductor device 70 constructed as described above, the voltage applied to the drain electrode 76 is divided by the high resistance element 98 to produce a plurality of different voltages which are then applied to the intra-insulating film electrodes 86. More specifically, intra-insulating film electrodes 86 that are closer to the drain electrode 76 have a higher voltage applied thereto. This causes a voltage to be applied to the semiconductor layer 72 under the insulating film 84 so as to extend the depletion layer formed around the gate electrode 82, resulting in enhanced dielectric strength of the semiconductor device 70.

The lateral power device (namely, lateral MOSFET) of the present embodiment is based on the same technique as described above in connection with the first embodiment. Therefore, as in the first embodiment, the configuration of the high resistance element 98 and material of which it is made may be altered without departing from the scope of the present invention. Further, although the high resistance element 98 has been described as being connected to the drain electrode 76 for reception of a voltage, it is to be understood that it may instead receive a voltage through other means.

Figure 11:
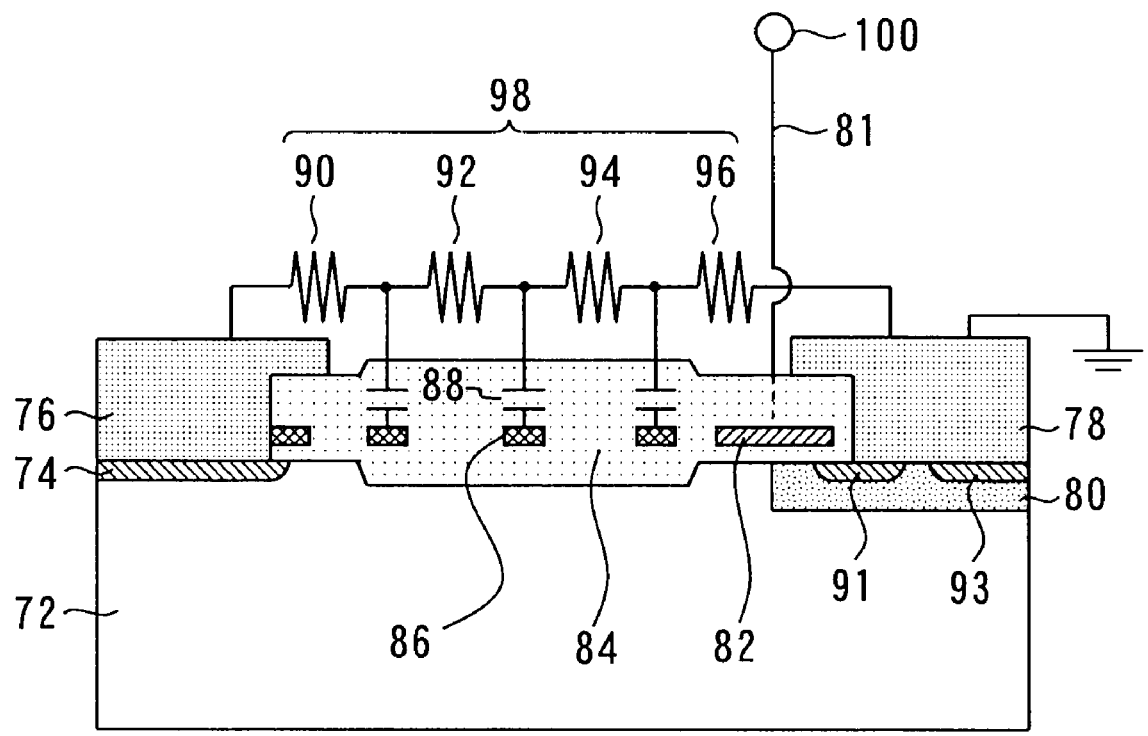
FIG. 11 shows high resistance element connected to the intra-insulating film electrodes by capacitors.

Although in the present embodiment the high resistance element 98 is electrically directly connected to the intra-insulating film electrodes 86, it is to be understood that the present invention is not limited to this particular arrangement. In other embodiments, for example, the high resistance element 98 may be connected to the intra-insulating film electrodes 86 by capacitors 88, as shown in FIG. 11, with the same effect.

Third Embodiment

Figure 12:
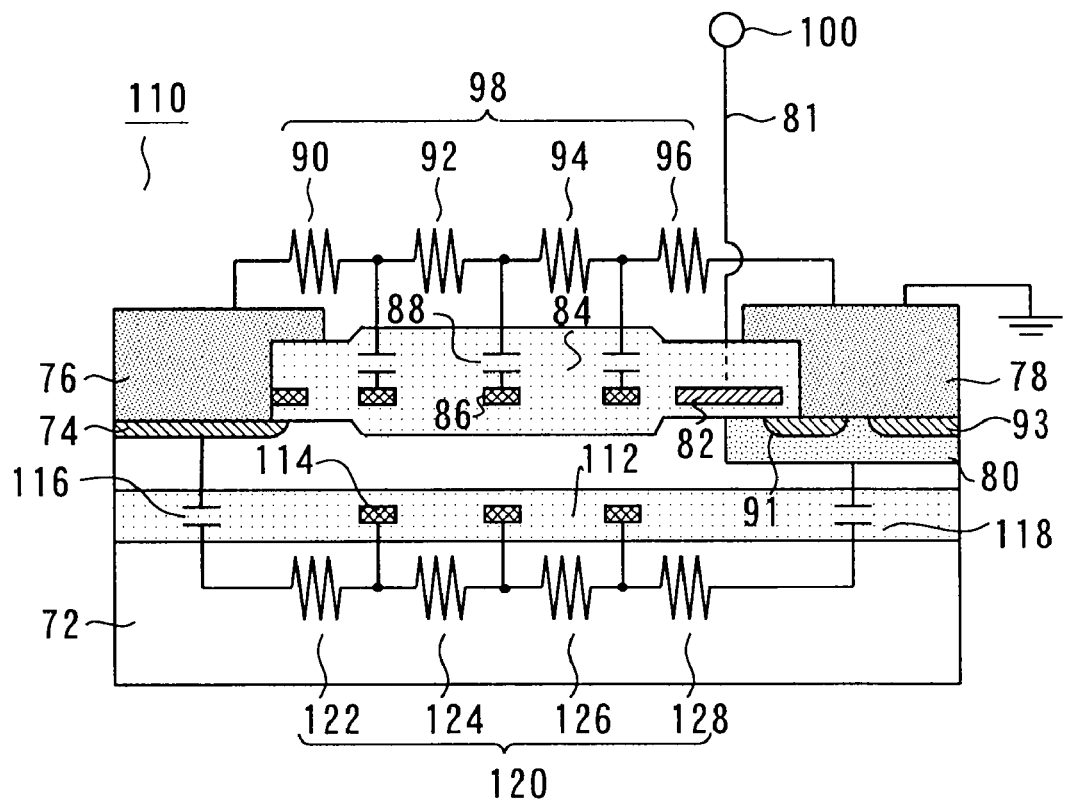
FIG. 12 is a cross-sectional view with a partial schematic.

A third embodiment of the present invention relates to a semiconductor device that includes means for reducing the electric field in its semiconductor layer. This embodiment will be described with reference to FIG. 12. FIG. 12 is a cross-sectional view with a partial schematic, showing a semiconductor device 110 of the present embodiment. This semiconductor device 110 differs from the semiconductor device 70 of the second embodiment shown in FIG. 8 in the following respects.

The semiconductor device 110 includes a burying insulating film 112 which is formed within the semiconductor layer 72 and spaced from the top and bottom surfaces of the semiconductor layer 72. The burying insulating film 112 has a plurality of intra-insulating film electrodes 114 formed therein. The semiconductor device also includes a resistance element 120 which is capacitively coupled at one end to the drain 74 and at the other end to the p-base region 80, as respectively represented by a capacitor 116 and a capacitor 118 (connected to the respective ends of the element 120) in FIG. 12. The resistance element 120 is divided into a plurality of sections or resistance elements to provide the desired voltages. Specifically, the resistance element 120 is made up of series-connected resistance elements 122, 124, 126, and 128. Each intra-insulating film electrode 114 is connected to a respective one of the resistance elements 122, 124, 126, and 128 (or a respective junction therebetween); specifically, the intra-insulating film electrode 114 closest to the drain 74 is connected to the resistance element (122) closest to the drain 74, the second closest intra-insulating film electrode 114 is connected to the second closest resistance element (124), and so on. With this arrangement, the voltage applied to the drain electrode 76 is divided by these resistance elements such that intra-insulating film electrodes 114 closer to the drain 74 have a higher voltage applied thereto.

Except for these features, the third embodiment is substantially similar to the second embodiment, and therefore will not be further described. It should be noted that in FIG. 12 those components common to FIG. 8 retain the same reference numerals.

Thus according to the present embodiment, the voltages applied to the intra-insulating film electrodes 114 between the gate electrode 82 and the drain electrode 76 gradually increase as the intra-insulating film electrodes 114 are located closer to the drain electrode 76, thereby reducing the electric field in the semiconductor layer 72.

The semiconductor device of the present embodiment shown FIG. 12 differs from that of the second embodiment shown in FIG. 8 in that it additionally includes the intra-insulating film electrodes 114, etc., as described above. That is, the semiconductor device of the present embodiment also includes the intra-insulating film electrodes 86 described in connection with the second embodiment. In a variation of this semiconductor device, however, the intra-insulating film electrodes 86 may be omitted while still retaining the advantages of the present embodiment. Further, although in the present embodiment the resistance element 120 is capacitively coupled to the drain 74, etc., it is to be understood that the present invention is not limited to this particular arrangement. For example, semiconductor devices of other embodiments may have a configuration such as that shown in FIG. 13. Specifically, in FIG. 13, a resistance element 134 is connected to the drain electrode 76 by a conductor 136, and connected to the source electrode 78 by a conductor 138. This results in the same advantages as described above.

Figure 13:
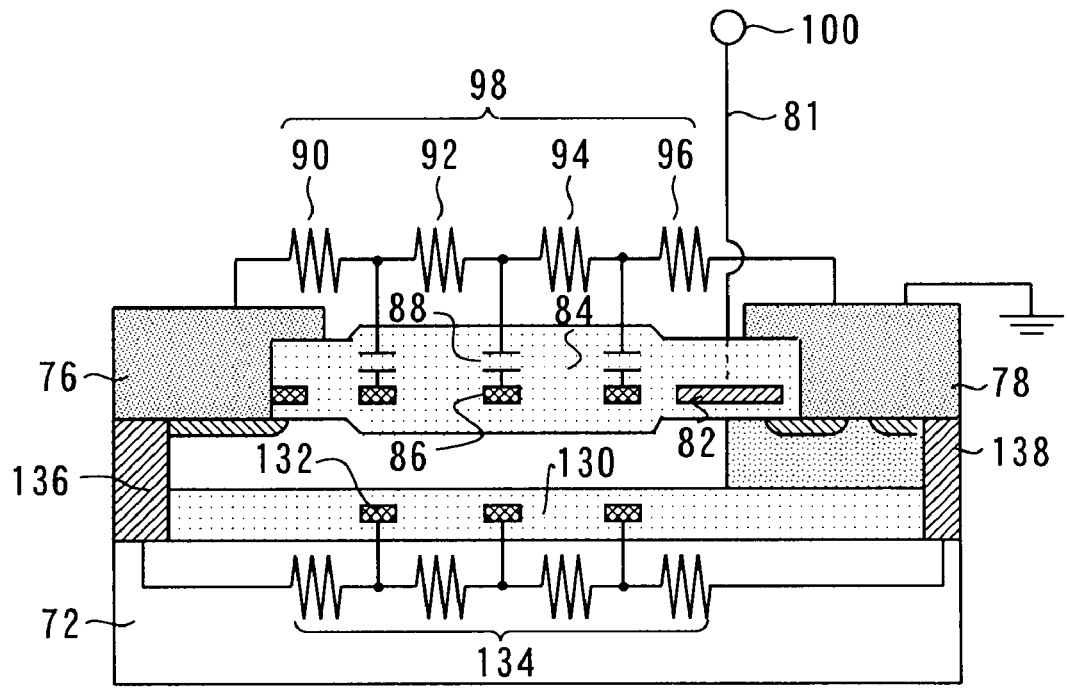
FIG. 13 shows a resistance element connected to the drain electrode by conductor, and connected to the source electrode.

Thus in FIG. 13 the resistance element 134 is directly (i.e., not capacitively) coupled to the drain and source electrodes by the conductors. In such a case, the resistance of the resistance element 134 is typically, but not limited to, approximately 600 MΩ. In FIG. 13, reference numeral 130 denotes a burying insulating film, and reference numeral 132 denotes a plurality of intra-insulating film electrodes formed within the burying insulating film 130. In the case of the semiconductor device of FIG. 12 in which the resistance element 120 is capacitively coupled to the drain, etc., on the other hand, the resistance of the resistance element 120 is typically, but not limited to, approximately 1 k Ω.

Fourth Embodiment

Figure 14:
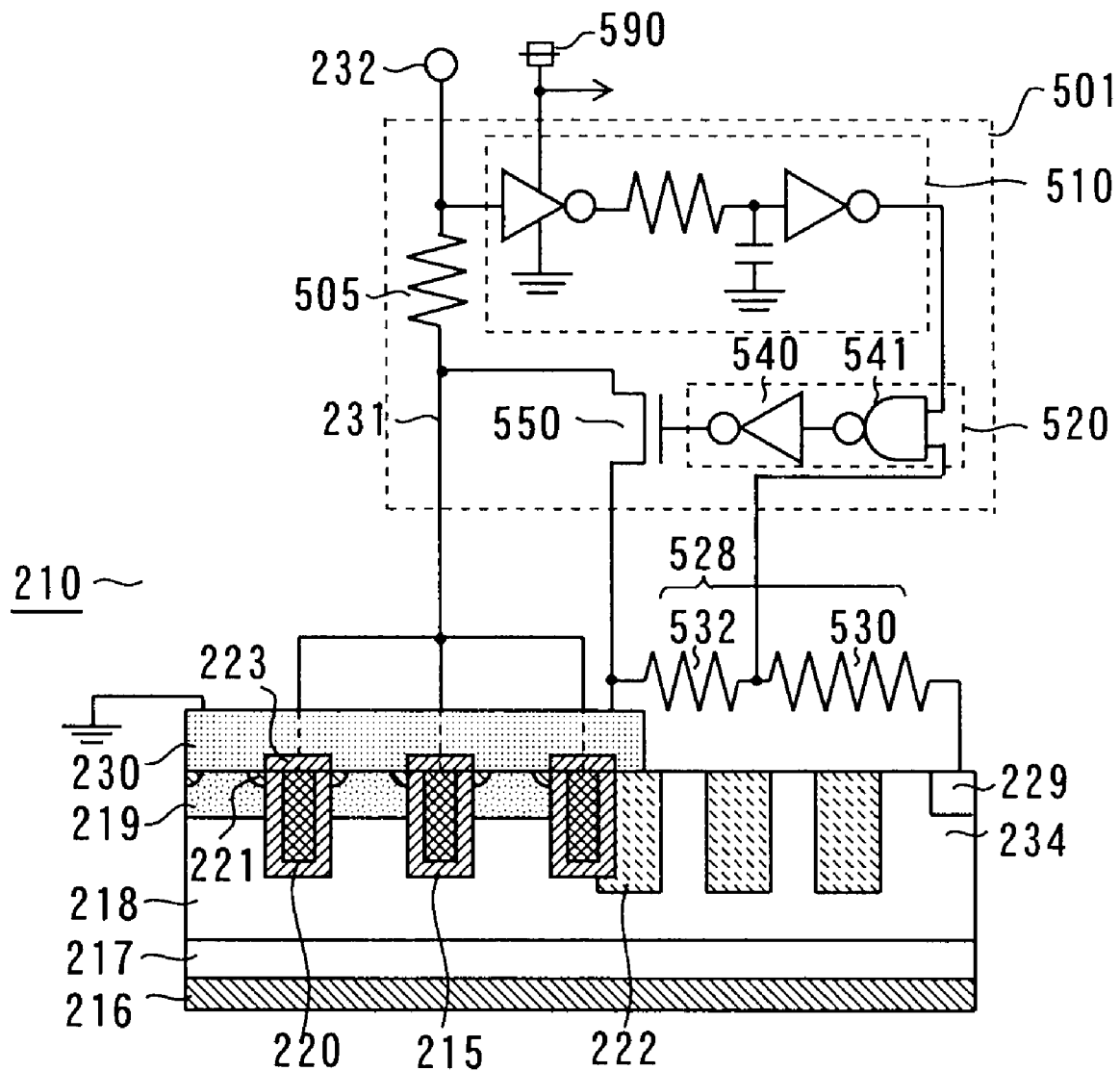
FIG. 14 shows a semiconductor device according to the fourth embodiment.

A fourth embodiment of the present invention relates to a semiconductor device which differs from those of the previous embodiments substantially in that it additionally has short circuit protection capability using a high resistance element which is similar to those characteristic of the previous embodiments. This semiconductor device, 210, will be described in detail with reference to FIGS. 14 to 27. The semiconductor device 210 has the same features as the semiconductor devices of the previous embodiments and is further characterized by its special means for controlling the gate electrode. The semiconductor device 210 is shown to include a vertical IGBT, although the present embodiment may be applied to any suitable type of power device having a gate electrode. As shown in FIG. 14, the semiconductor device 210 of the present embodiment is substantially similar to that of the first embodiment, except that it includes a short circuit protection circuit 501. The following description will be primarily directed to this short circuit protection circuit 501. The semiconductor device 210 also includes a semiconductor layer 218, gate insulating films 215, gate electrodes 220, insulating films 223, a p-base layer 219, $n^+$ emitter layers 221, an emitter electrode 230, a collector electrode 216, a $p^+$ collector layer 217, an $n^+$ channel stopper region 229 of a peripheral portion 234, guard rings 222, high resistance elements 530 and 532, a gate wire 231, and a gate terminal (or gate bonding pad) 232.

The short circuit protection circuit 501 includes a gate resistance 505, which is connected between the gate terminal 232 and the gate wire 231, a delay circuit 510, a short circuit detection circuit 520, and a cutoff circuit 550. The semiconductor device 210 also includes high resistance elements 530 and 532 similar to the high resistance element 28 described in connection with the first embodiment. These resistance elements form a collector-emitter voltage detection circuit 528 (serving as a level converter or voltage divider), which is utilized by the short circuit protection circuit 501.

The delay circuit 510 receives the gate drive signal input to the gate terminal 232 and outputs it after a predetermined time delay (described later), and is implemented by a combination of two NOT circuits (or inverters), a resistance, and a capacitor (see FIG. 14), as is known in the art. The output of the delay circuit 51 is applied to one input of the short circuit detection circuit 520. The collector-emitter voltage detection circuit 528 outputs a signal proportional to the collector-emitter voltage of the IGBT. Specifically, the collector-emitter voltage detection circuit 528 is a voltage divider including the series-connected high resistance elements 530 and 532 connected between the emitter electrode 230 and the channel stopper region 229 of the peripheral portion 234. It divides the collector-emitter voltage to produce an appropriate output voltage (or detection voltage) proportional to the collector-emitter voltage.

The voltage division ratio of the collector-emitter voltage detection circuit 528 (a voltage divider) must be such that its output voltage matches the logic levels of the signals in the short circuit protection circuit. Specifically, for example, the collector-emitter voltage detection circuit 528 is designed to output a voltage of 15 V (approximately equal to the gate drive signal) when a high voltage of 600 V is applied across the series connected high resistance elements 530 and 532.

The output of the collector-emitter voltage detection circuit 528 is applied to the other input of the short circuit detection circuit 520. The short circuit detection circuit 520 receives the output signal of the delay circuit 510 and the output signal of the collector-emitter voltage detection circuit 528, and, based on the levels of these signals, outputs a control signal indicating whether or not the load circuit connected to the IGBT is short circuited.

More specifically, the short circuit detection circuit 520 outputs a high level signal if the output of the delay circuit 510 and the output of the collector-emitter voltage detection circuit 528 are at a high level. (It should be noted that the output of the delay circuit 510 is a delayed gate drive signal and the output of the collector-emitter voltage detection circuit 528 is a signal proportional to and derived from the collector-emitter voltage.) Thus, the short circuit detection circuit 520 is a two-input AND logic circuit and is implemented using a NOT circuit 540 and a NAND circuit 541. The cutoff circuit 550 shunts or does not shunt the gate wire 231 (or gate electrodes 220) to the emitter electrode 230 depending on the output of the short circuit detection circuit 520, thereby turning on and off the IGBT. In this example, the cutoff circuit 550 includes an N-type MOS transistor, and when the output of the short circuit detection circuit 520 is at a high level, the cutoff circuit 550 shunts the gate wire 231 (or gate electrodes 220) to the emitter electrode 230, making the potential of the gate electrodes 220 equal to the potential of the emitter electrode 230 (i.e., 0 V).

The gate resistance 505 connected between the gate terminal 232 and the gate wire 231 (or the gate electrodes 220) serves to prevent the signal level on the gate terminal 232, i.e., on the input of the delay circuit 510, from falling to a low level when the gate voltage is pulled down to 0 V by the cutoff circuit 550.

The operation of the semiconductor device 210 of the present embodiment will now be described. The gate drive signal on the gate terminal 232 is delivered to the gate electrodes 220 through the gate resistance 505. The same gate drive signal is also input to the delay circuit 510. The delay circuit 510 outputs the received gate drive signal to the NAND circuit 541 after a predetermined time delay.

The NAND circuit 541 receives the delayed gate drive signal from the delay circuit 510 and outputs a low level (0) signal to the NOT circuit 540 if both the delayed gate drive signal and the signal received from the peripheral portion 234 are at a high level. The NOT circuit 540 converts the low level signal to a high level signal and outputs it to the cutoff circuit 550, thereby turning on the cutoff circuit 550. As a result, the gate electrodes 220 (or the gate wire 231) is shunted to ground, preventing turn-on of the IGBT.

It should be noted that a voltage high enough to turn on the power device (i.e., the IGBT) when it is applied to the gate of the device is interpreted as a high level (or high logic level) by the NAND circuit 541. That is, the gate drive signal for turning on the IGBT is interpreted as a high level. Further, the collector-emitter voltage detection circuit 528 is adapted to output such a voltage (e.g., 15 V) when a high voltage of, e.g., several hundred volts is applied to the $n^+$ channel stopper region 229 of the peripheral portion 234 (i.e., applied between the collector and emitter of the device). The short circuit detection circuit 520 outputs a signal to turn on the cutoff circuit 550 (N-type MOS transistor) and thereby shunt the gate wire 231 (or the gate electrodes 220) to ground when both inputs of the NAND circuit 541 are at a high level, i.e., when both the voltage of the delayed gate drive signal (output from the delay circuit 510) and the collector-emitter voltage are high. In this way, the short circuit detection circuit 520 and the cutoff circuit 550 together protect the IGBT when the load circuit is short circuited, as described in detail later. Thus, the short circuit detection circuit 520 and the cutoff circuit 550 are means for grounding the gate wire 231 (or the gate electrodes 220). It should be noted that in other embodiments other means may be used to protect the IGBT from shirt circuit by grounding its gate wire (or gate) based on the state of the gate drive signal and the voltage of the semiconductor layer.

Figure 15:
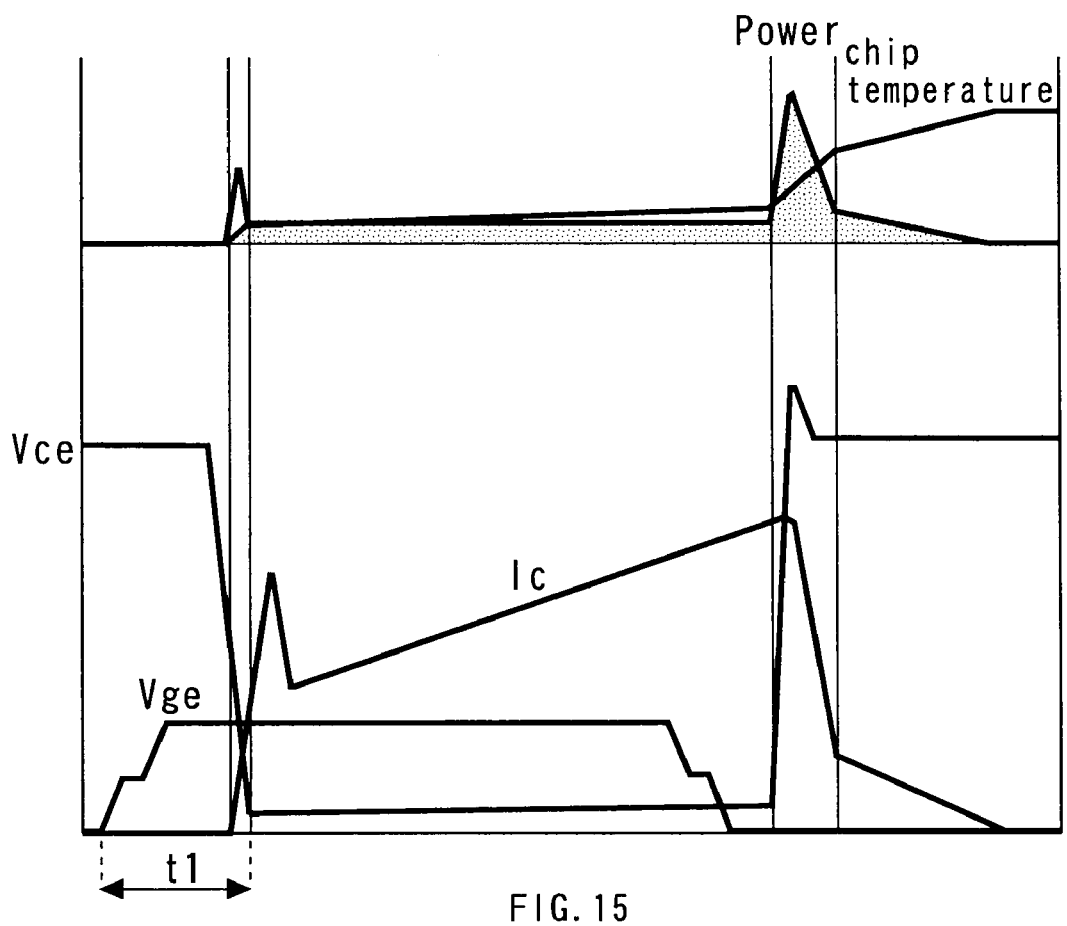
FIG. 15 shows waveforms of signals produced during the normal operation.
Figure 16:
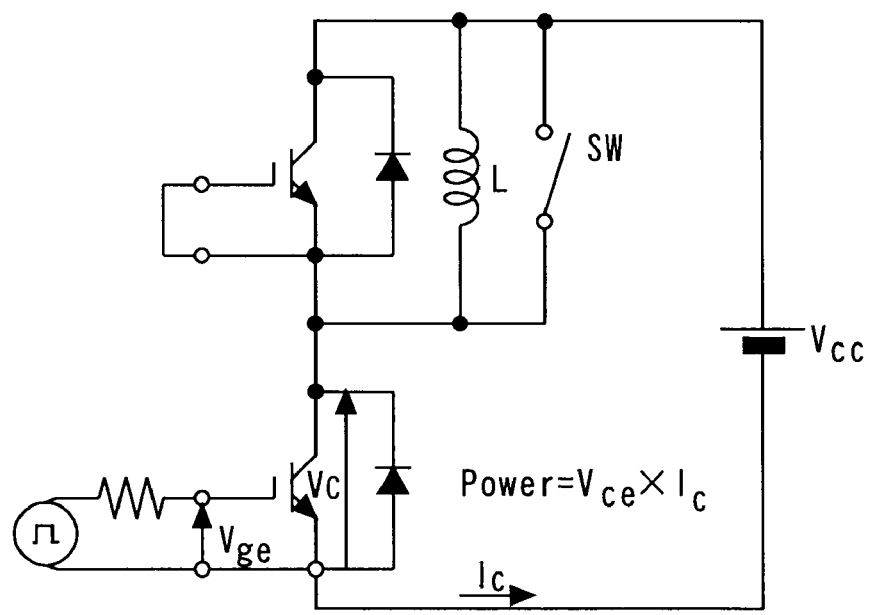
FIG. 16 shows a typical load circuit.

The following description will be directed to the optimum amount of time by which the gate drive signal is preferably delayed by the delay circuit 510 of the present embodiment. FIG. 15 shows waveforms of signals produced during the normal operation of the IGBT, measured using the measurement circuit shown in FIG. 16. The turn-on time t1 of the IGBT will be first described with reference to FIG. 15. In the case where a widely-used general IGBT is connected to a typical load circuit as shown in FIG. 16, a DC voltage of several hundred volts appears between the collector and emitter of the IGBT when it is turned off. (The voltage between the collector and the emitter is hereinafter referred to as the "collector voltage" and denoted by Vce.) Then if a voltage, or a high level signal, of ten-odd volts (typically approximately 15 V) is applied between the gate and emitter of the IGBT, a current flows from the collector to the emitter and the IGBT is turned on. (The voltage between the gate and the emitter is hereinafter referred to as the "gate voltage" and denoted by Vge, and the current flowing from the collector to the emitter is hereinafter referred to as the "collector current" and denoted by Ic.) Then if the gate voltage is reduced to a ground voltage of 0 V or a negative voltage of minus several volts (a low level signal), the collector current is cut off. The turn-on time t1 is the period from the time when the gate voltage Vge begins to rise (from 0 V) until the collector voltage Vce falls to its minimum.

Figure 17:
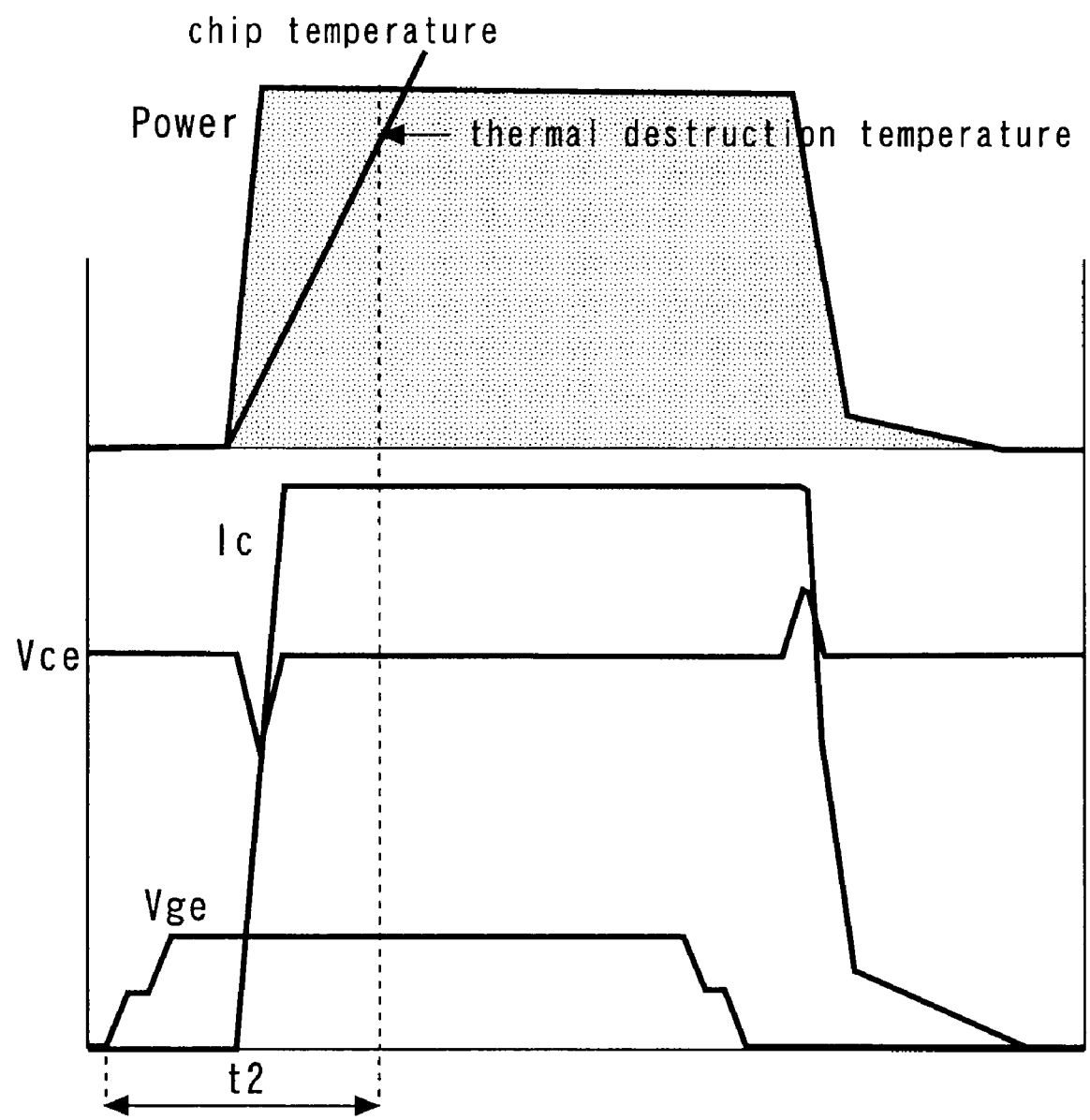
FIG. 17 shows waveforms of signals produced in the operation of the IGBT shown in FIG. 16.

FIG. 17 shows waveforms of signals produced in the operation of the IGBT shown in FIG. 16 after the load L in the measurement circuit is short circuited by turning on the switch SW. With reference to FIG. 17, the following describes the time t2 it takes for the IGBT to suffer thermal destruction or other degradation after the load circuit is short circuited. Let it be assumed that the load connected to the IGBT is short circuited accidentally or erroneously, etc. In this case, the collector voltage Vce remains high even if the gate voltage Vge is set at a high level. In such a case, the collector current Ic excessively increases resulting in thermal destruction or other degradation of the IGBT, as shown in FIG. 17. The symbol t2 represents the period from the time when the gate voltage Vge begins to rise (from 0 V after the load circuit is short circuited) until the IGBT suffers thermal destruction or other degradation as a result of the collector voltage Vce being high for an extended period of time.

Figure 18:
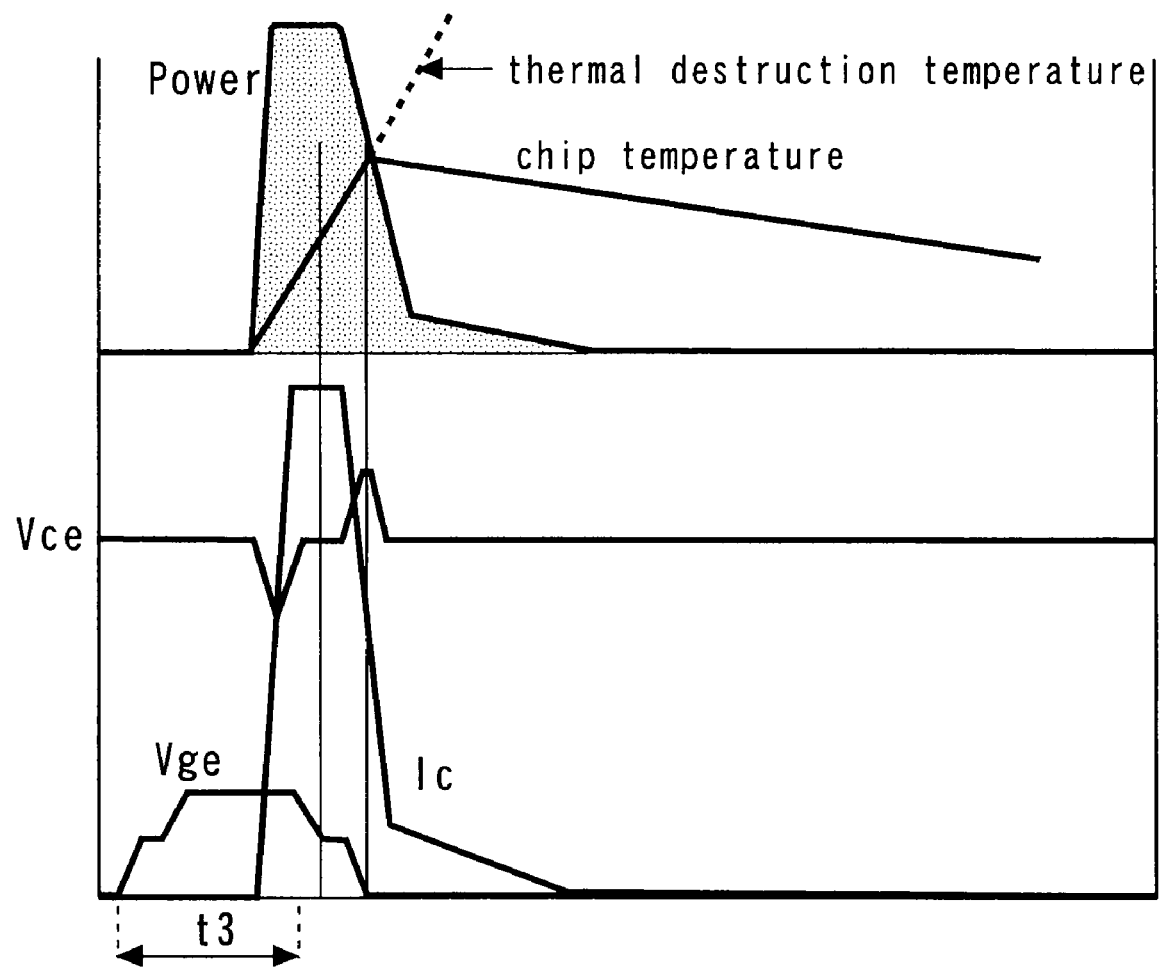
FIG. 18 shows waveforms of signals produced in the operation of the IGBT of the present embodiment after the load circuit is short circuited.

In view of the above, the amount of time, or delay, t3 by which the gate drive signal is delayed by the delay circuit 510 is adjusted to be longer than the turn-on time t1 and shorter than the period t2. This delay t3 will be further described with reference to FIG. 18. FIG. 18 shows waveforms of signals produced in the operation of the IGBT of the present embodiment after the load circuit is short circuited. Since the delay t3 is longer than the turn-on time t1, the cutoff circuit 550 does not make the potential of the gate wire 231 (or gate electrodes 220) equal to that of the emitter electrode 230 (i.e., 0 V) during the normal turn-on operation of the IGBT, as can be seen from the waveforms of FIG. 18. On the other hand, since the delay t3 is shorter than the period t2, if the load circuit of the power device is short circuited and, as a result, the collector Ic is greatly increased, the cutoff circuit 550 makes the potential of the gate wire 231 (or gate electrodes 220) equal to that of the emitter electrode 230 (i.e., 0 V) to turn off the IGBT before the IGBT suffers degradation (thermal destruction), thus preventing degradation of the IGBT due to the short circuit.

Figure 19:
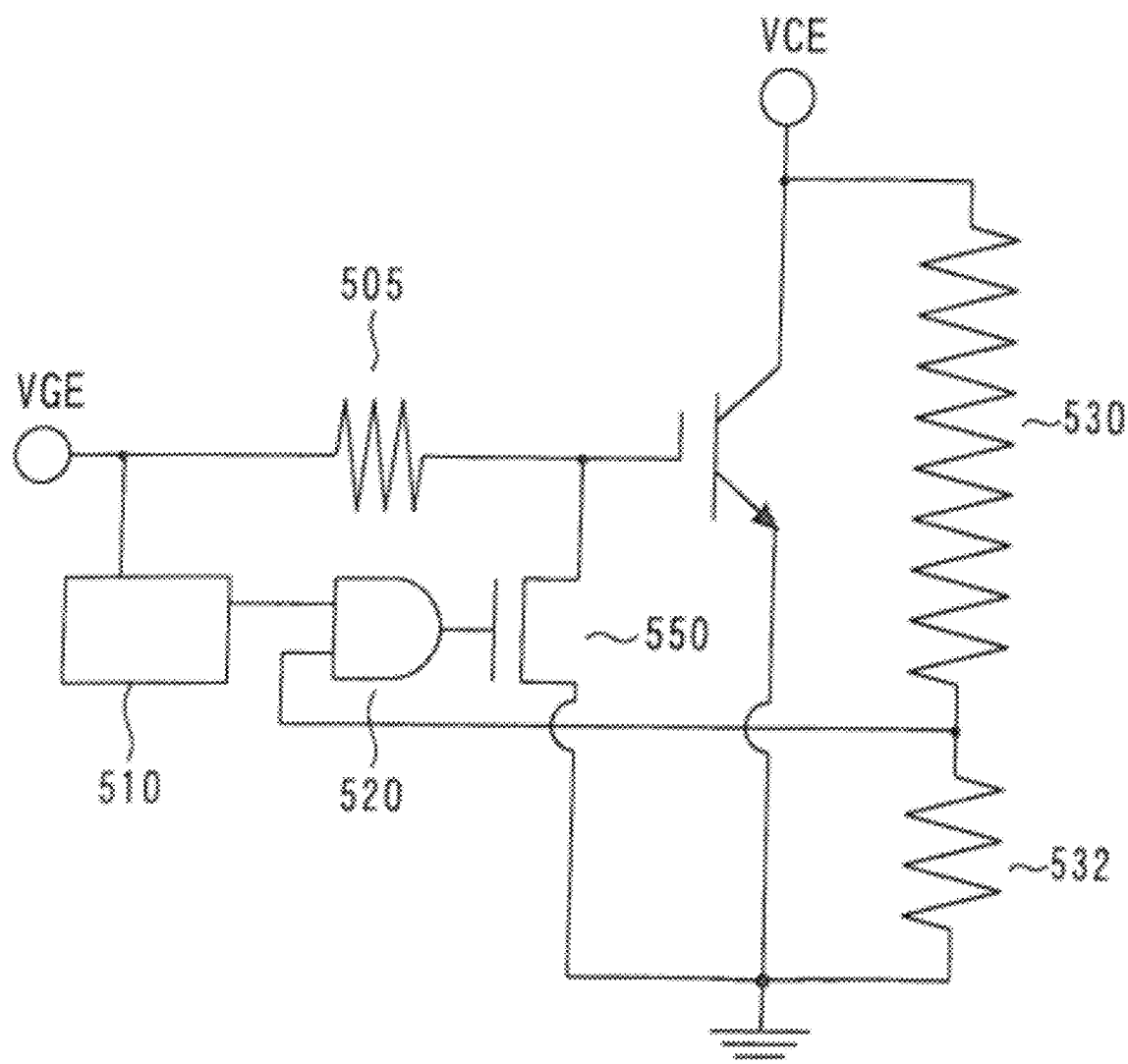
FIG. 19 is a circuit diagram showing the semiconductor device of the fourth embodiment in a simplified manner.

It should be noted that FIG. 19 is a circuit diagram showing the semiconductor device 210 of the present embodiment in a simplified manner.

Various alterations may be made to the short circuit protection circuit 501 of the present embodiment. For example, although in the present embodiment the short circuit detection circuit 520 receives the voltage of the peripheral portion 234 through the resistance element 530, the present invention only requires that the short circuit detection circuit 520 receive a voltage proportional to the collector voltage Vce. Further, although in the present embodiment the short circuit detection circuit 520 and the cutoff circuit 550 ground the gate wire 231 by shunting the gate wire 231 to the emitter electrode 230, it is to be understood that in other embodiments other methods may be used to ground the gate wire 231.

Further, the delay circuit 510, the short circuit detection circuit 520, etc. in the short circuit protection circuit 501 may be powered by a voltage supplied from a dedicated power supply terminal. Or alternatively, they may be powered by a gate drive voltage from the gate terminal 232 or a voltage output from the voltage divider (528) consisting of the high resistance elements 530 and 532. This eliminates the need for a power supply bonding pad, allowing the size of the semiconductor device to be reduced as compared to when a dedicated power supply source is used for the short circuit protection circuit 501.

Figure 20:
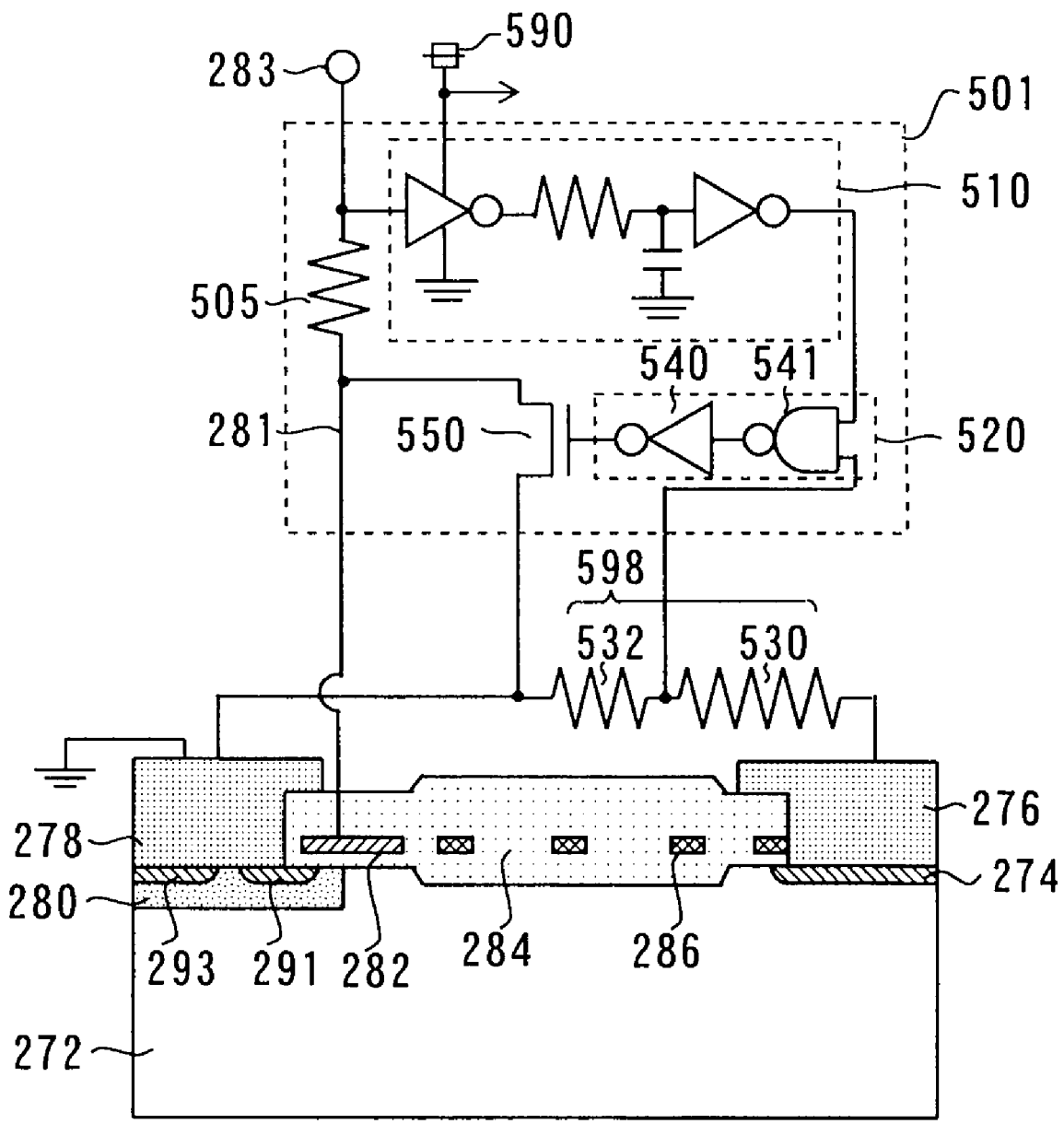
FIG. 20 shows a variation of the semiconductor device of the second embodiment.

The technical idea of the present embodiment may be applied, for example, to lateral power devices in which a gate, source, and drain are formed in the surface of the semiconductor layer. FIG. 20 shows such a power device. Specifically, FIG. 20 shows a variation of the semiconductor device of the second embodiment, wherein it additionally has short circuit protection capability using a high resistance element similar to that characteristic of the second embodiment shown in FIG. 8. This semiconductor device is substantially similar to that of the second embodiment, except that it additionally includes a short circuit protection circuit 501 similar to that described above in connection with the present embodiment.

The power device shown in FIG. 20 includes a semiconductor layer 272 (an n⁻ layer), an n⁺ drain 274, a drain electrode 276, a p-base region 280, an n⁺ source 291, a p⁺ region 293, a source electrode 278, an insulating film 284, a gate electrode 282, intra-insulating film electrodes 286, a high resistance element 530, a high resistance element 532, a gate wire 281, and a gate terminal 283, as in the second embodiment. The power device also includes a gate resistance 505 connected between the gate terminal 283 and the gate wire 281, a delay circuit 510, a short circuit detection circuit 520, a cutoff circuit 550, and a drain-source voltage detection circuit 598 (serving as a level converter or voltage divider) including the high resistance elements 530 and 532. These components (including the grounding means) are similar to the corresponding components described above, and therefore will not be described herein.

Figure 21:
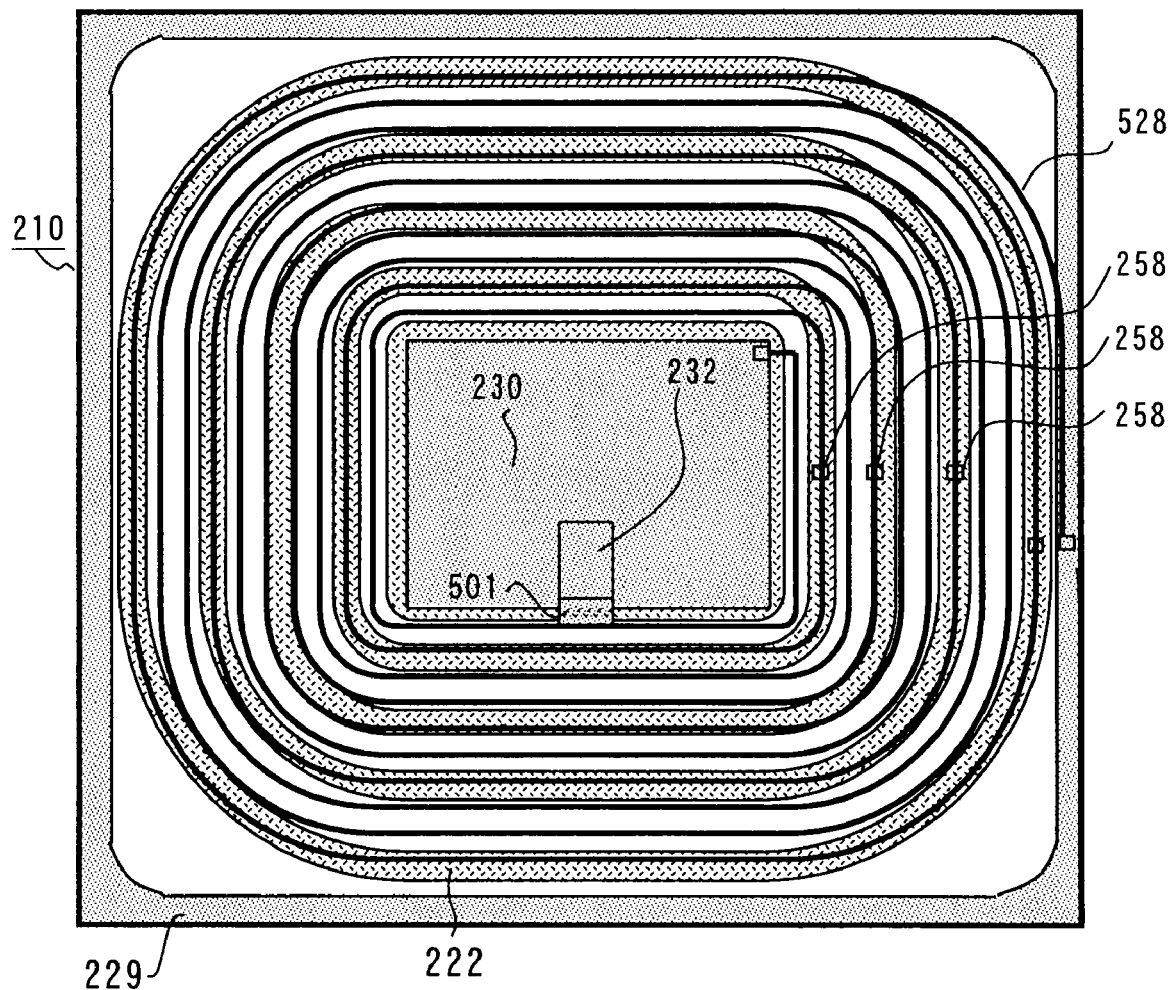
FIG. 21 shows a single spiral strip.

The short circuit protection technique described in connection with the present embodiment may be combined with the dielectric strength enhancing technique described in connection with the first and second embodiments to provide a semiconductor device having improved performance. Specifically, a resistance element for enhancing the dielectric strength of a power device (such as the high resistance element 28 shown in FIG. 1) can be designed to also serve as a resistance element used to protect the device from short circuit (such as the resistance elements 530 and 532 shown in FIG. 14), and vice versa. FIG. 21 is a plan view of such a semiconductor device. In FIG. 21 those components common to FIG. 14 retain the same reference numerals and will not be further described. FIG. 21 is related to FIG. 14 in the same manner as FIG. 2 is related to FIG. 1. As shown in FIG. 21, the collector-emitter voltage detection circuit 528 (serving as a level converter or voltage divider) is a single spiral strip connected at one end to the channel stopper region 229 and at the other end to the emitter electrode 230. The short circuit protection circuit 501 is formed near the gate terminal (or bonding pad) 232 to accommodate the layout requirements.

Figure 2:
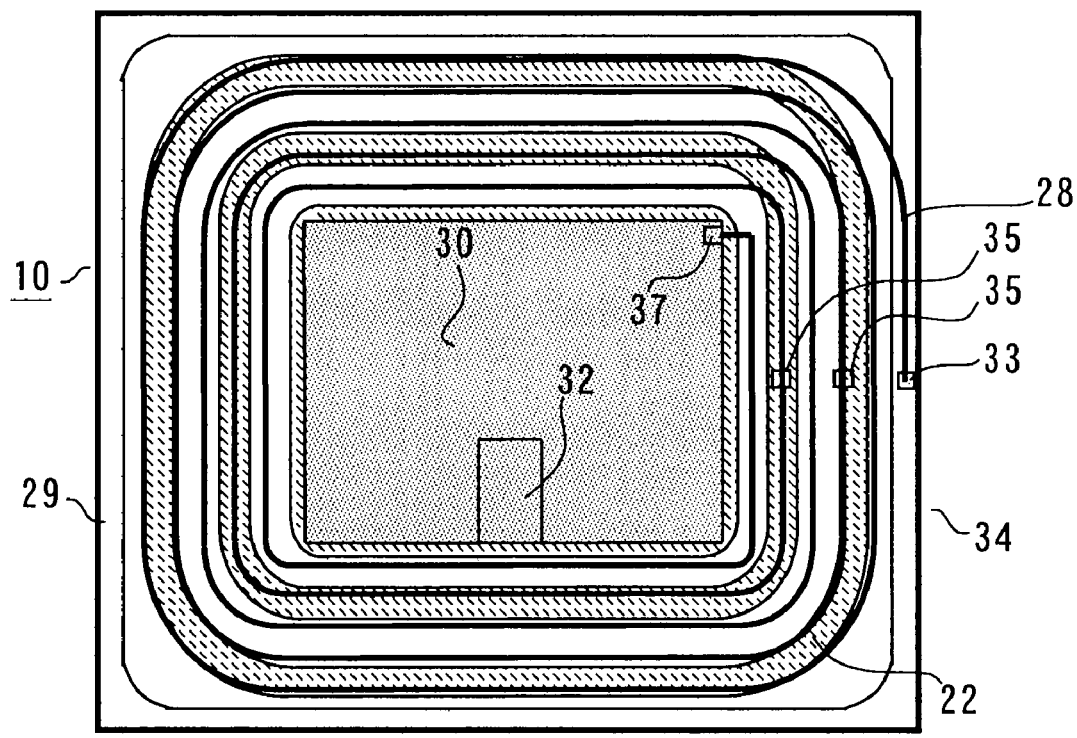
FIG. 2 is plan view of high resistance element.
Figure 3:
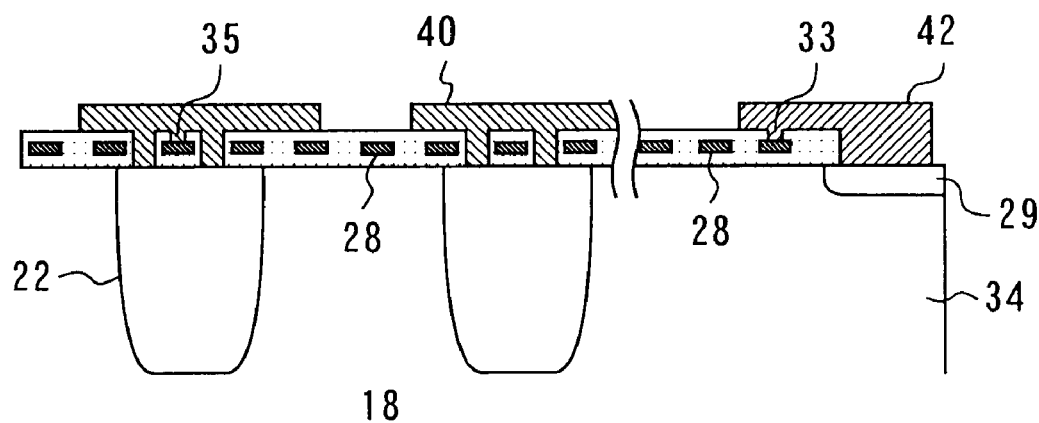
FIG. 3 is an enlarged cross-sectional view of a portion of the semiconductor device.

The collector-emitter voltage detection circuit 528 is connected at intermediate points to the guard rings 22 by contacts 258 and forms a resistance element corresponding to the high resistance element 28 shown in FIG. 1. Thus, the collector-emitter voltage detection circuit 528 can serve as a voltage divider and includes resistance elements 530 and 532 as shown in FIG. 14. The junction between the resistance elements 530 and 532 is connected to one input of the short circuit detection circuit 520 in the short circuit protection circuit 501. Thus the collector-emitter voltage detection circuit 528 is simple in construction, yet can be used to protect the semiconductor device from short circuit while at the same time enhancing its dielectric strength.

Figure 22:
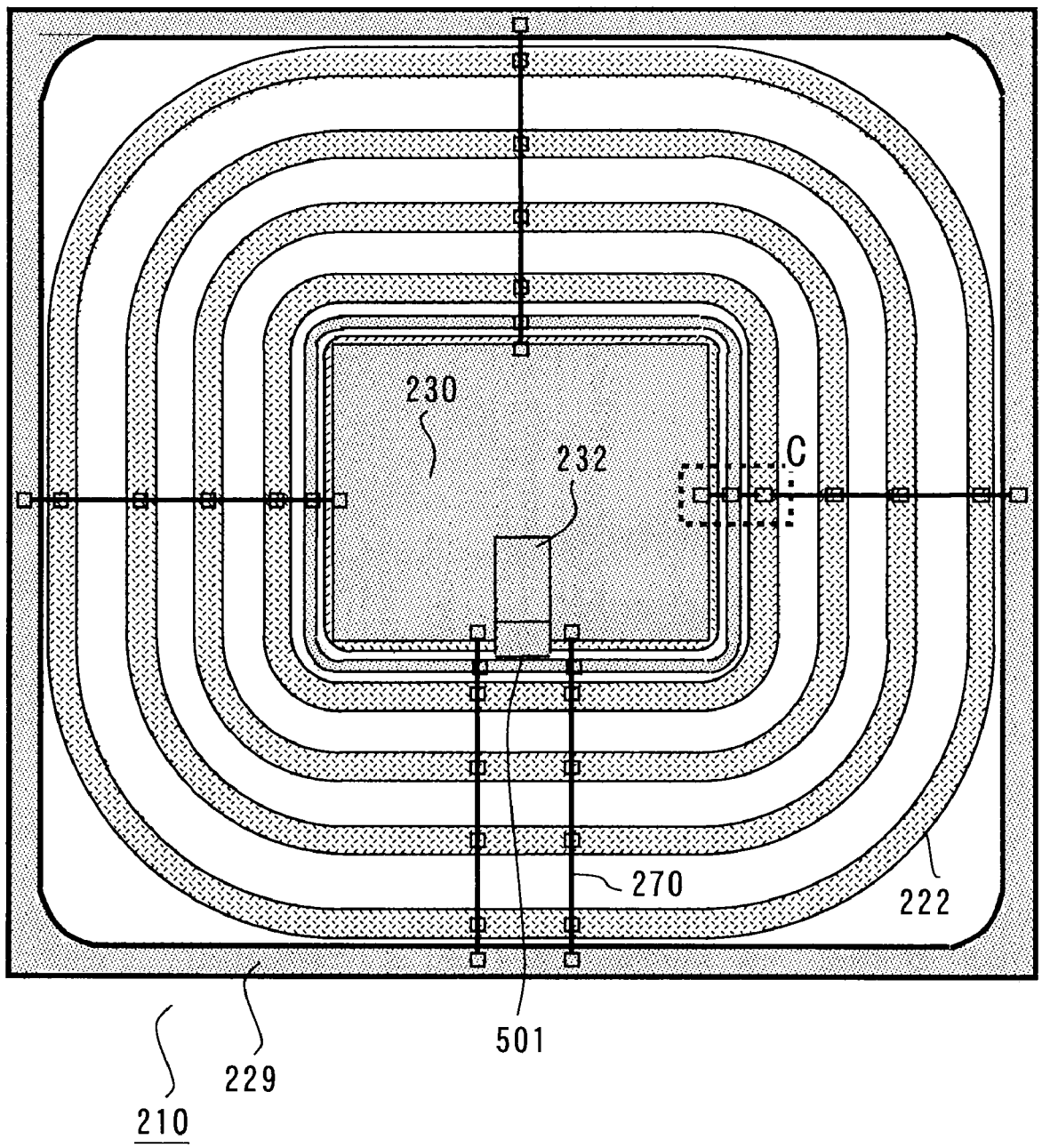
FIG. 22 shows a linear resistance element.
Figure 23:
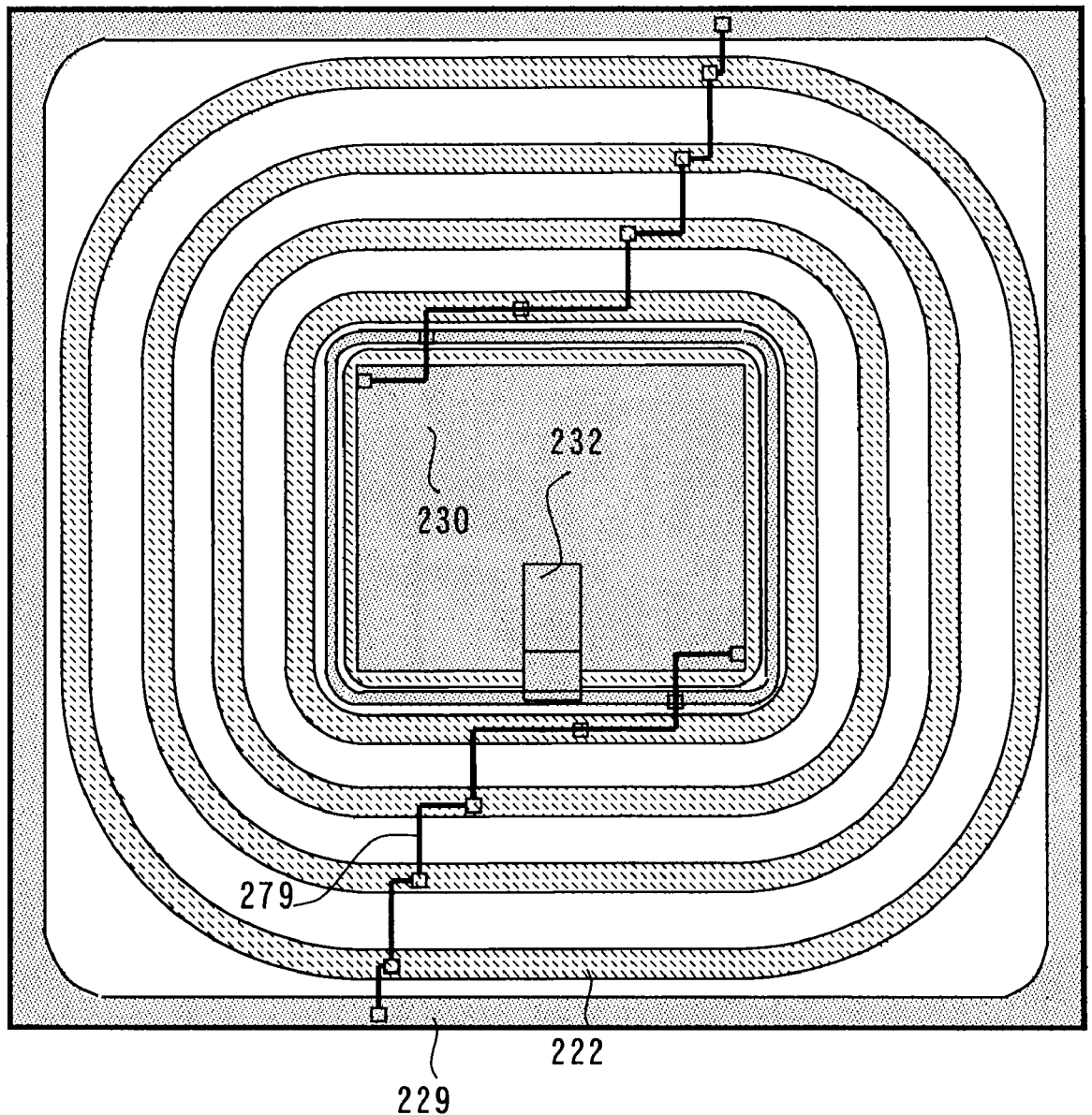
FIG. 23 shows a stepped resistance element.
Figure 24A:
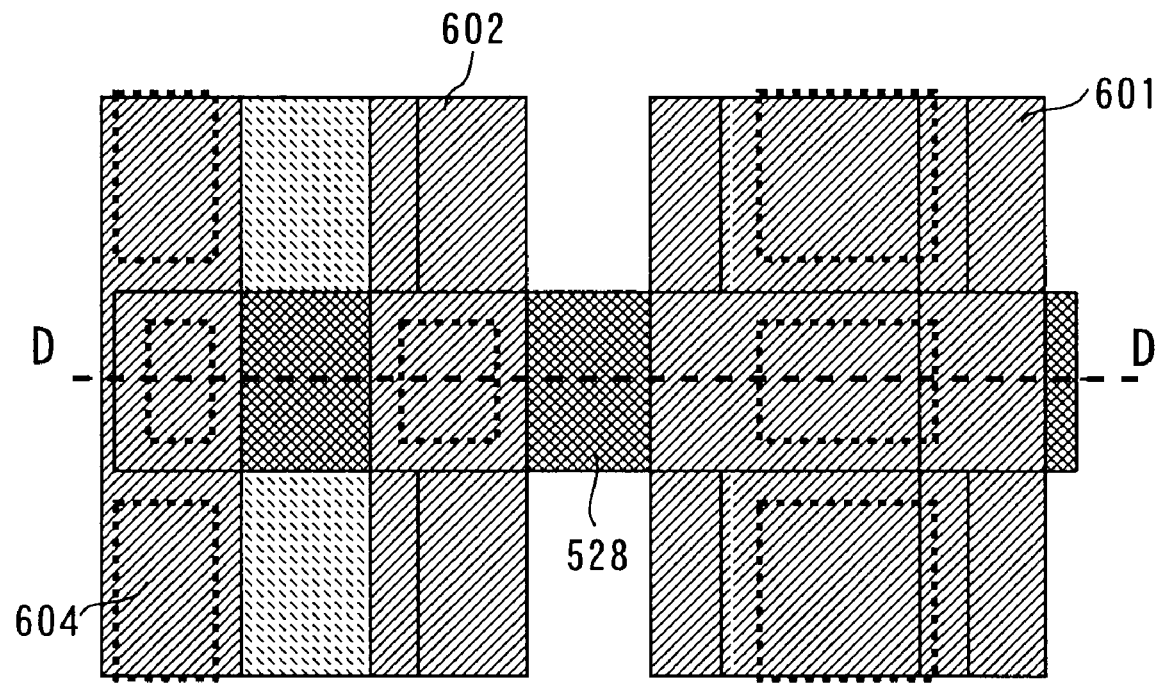
FIG. 24A is an enlarged plan view of the portion of FIG. 22 enclosed by broken line C.
Figure 24B:
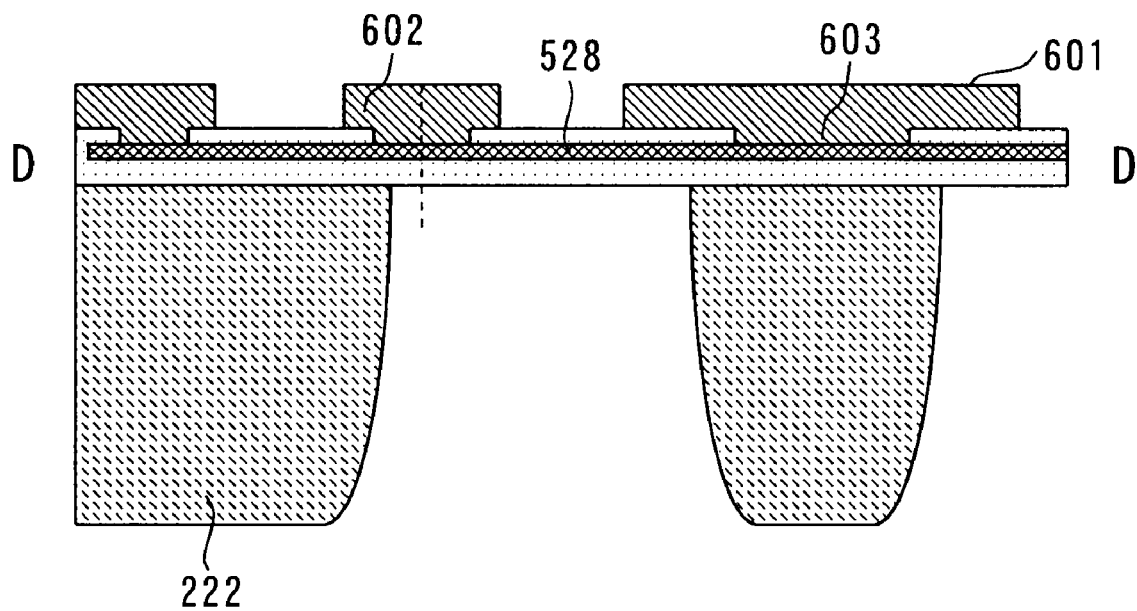
FIG. 24B is a cross-sectional view taken along broken line D-D of FIG. 24A.

The spiral-shaped collector-emitter voltage detection circuit 528 (which is a high resistance element serving as a level converter or voltage divider) may be replaced by high resistance elements of various shapes. For example, the semiconductor device may includes high resistance elements 270 of a linear shape as shown in FIG. 22 or high resistance elements 279 of a stepped shape as shown in FIG. 23. The advantages of resistance elements of these shapes are the same as described in connection with the first embodiment. In the case of the configurations shown in FIGS. 22 and 23 which include a plurality of high resistance elements (i.e., voltage dividers), slightly different voltages may be applied from these high resistance elements to each guard ring or to the short circuit detection circuit 520 (for detection of the collector voltage Vce). If the design requires that the potential of each guard ring, etc. be uniform throughout its surface, an aluminum conductor, etc. may be formed to interconnect the connections, as shown in FIGS. 24A and 24B. FIG. 24A is an enlarged plan view of the portion of FIG. 22 enclosed by broken line C, and FIG. 24B is a cross-sectional view taken along broken line D-D of FIG. 24A. In FIGS. 24A and 24B, reference numerals 601 and 602 denote conductive patterns (or wires) of aluminum, etc., 603 denotes a contact connecting a high resistance element to a conductive pattern, and 604 denotes a contact connecting a guard ring to a conductive pattern.

Generally, in the case of vertical power devices, it is desired that components of the short circuit protection circuit 501 described in connection with the present embodiment be formed on an SOI structure. Further, it is advantageous that the short circuit protection circuit 501 be formed on a different chip than the power device in order to facilitate adjustment of the time constant, etc. of the delay circuit 510.

Figure 25:
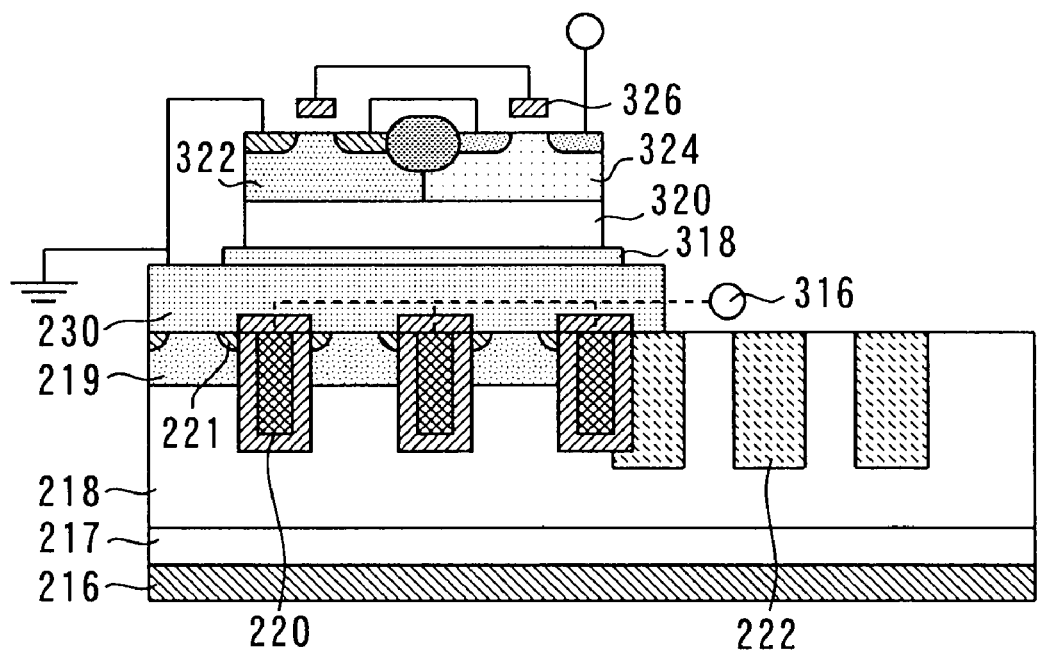
FIG. 25 shows a semiconductor device having a flip-flop circuit.

For example, the delay circuit 510 and the short circuit detection circuit 520 may be formed on a different substrate than the power device. FIG. 25 shows such a configuration. In FIG. 25, the output of the NOT circuit 540 (see FIG. 14) is applied to the cutoff circuit through a flip-flop circuit (having two stable states). The use of a flip-flop circuit allows arbitrary choices to be made as to whether to use a gate resistance, and if so, the value and position of the gate resistance.

Referring to FIG. 25, a conductive adhesive layer 318 (solder, etc.) is formed on the emitter electrode 230, and a semiconductor substrate 320 is formed on the conductive adhesive layer 318. A P-well region 322 and an N-well region 324 are formed on the semiconductor substrate 320. These regions 322 and 324 form a CMOS structure for forming the flip-flop circuit. The delay circuit 510 and the short circuit detection circuit 520 are also formed on the semiconductor substrate 320. Thus, the flip-flop circuit, the delay circuit 510, and the short circuit detection circuit 520 are formed on a different substrate (i.e., the semiconductor substrate 320) than the power device. This eliminates the need to change the entire configuration of the semiconductor device if the power device undergoes a design change.

Figure 26:
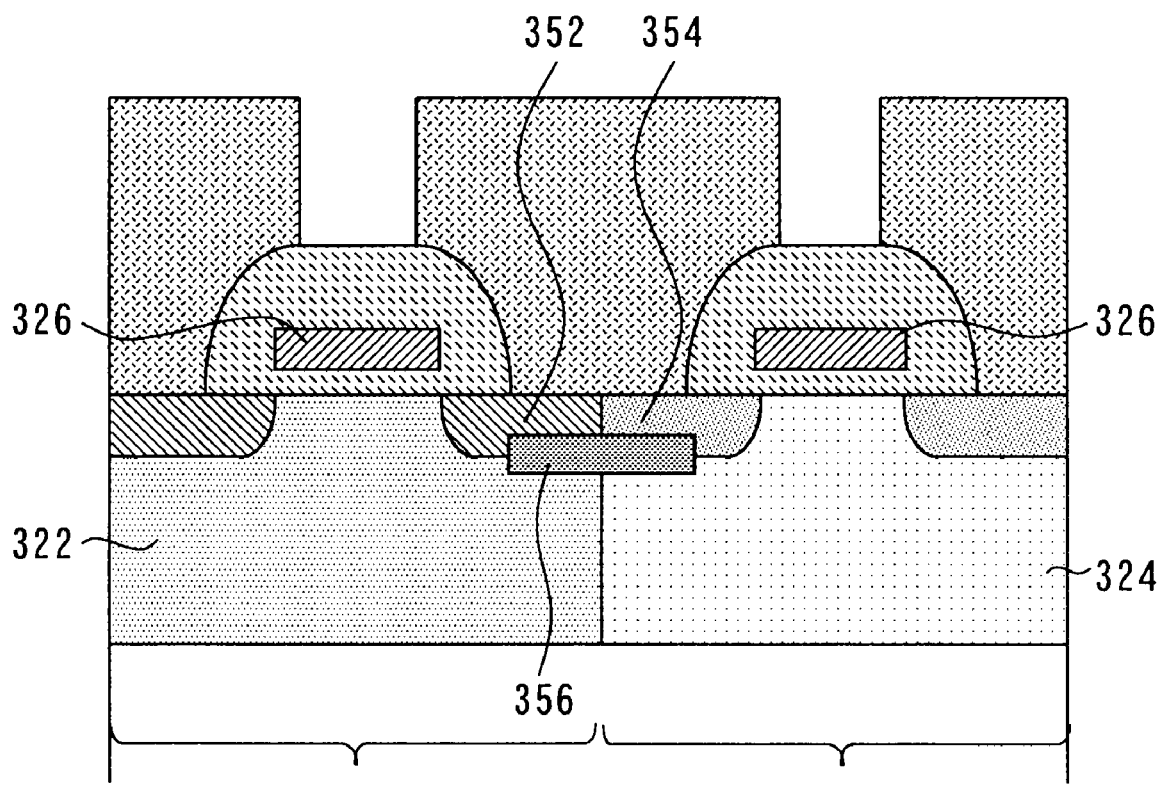
FIG. 26 shows an insulating film formed immediately under a drain of NMOS and a drain of PMOS.
Figure 27:
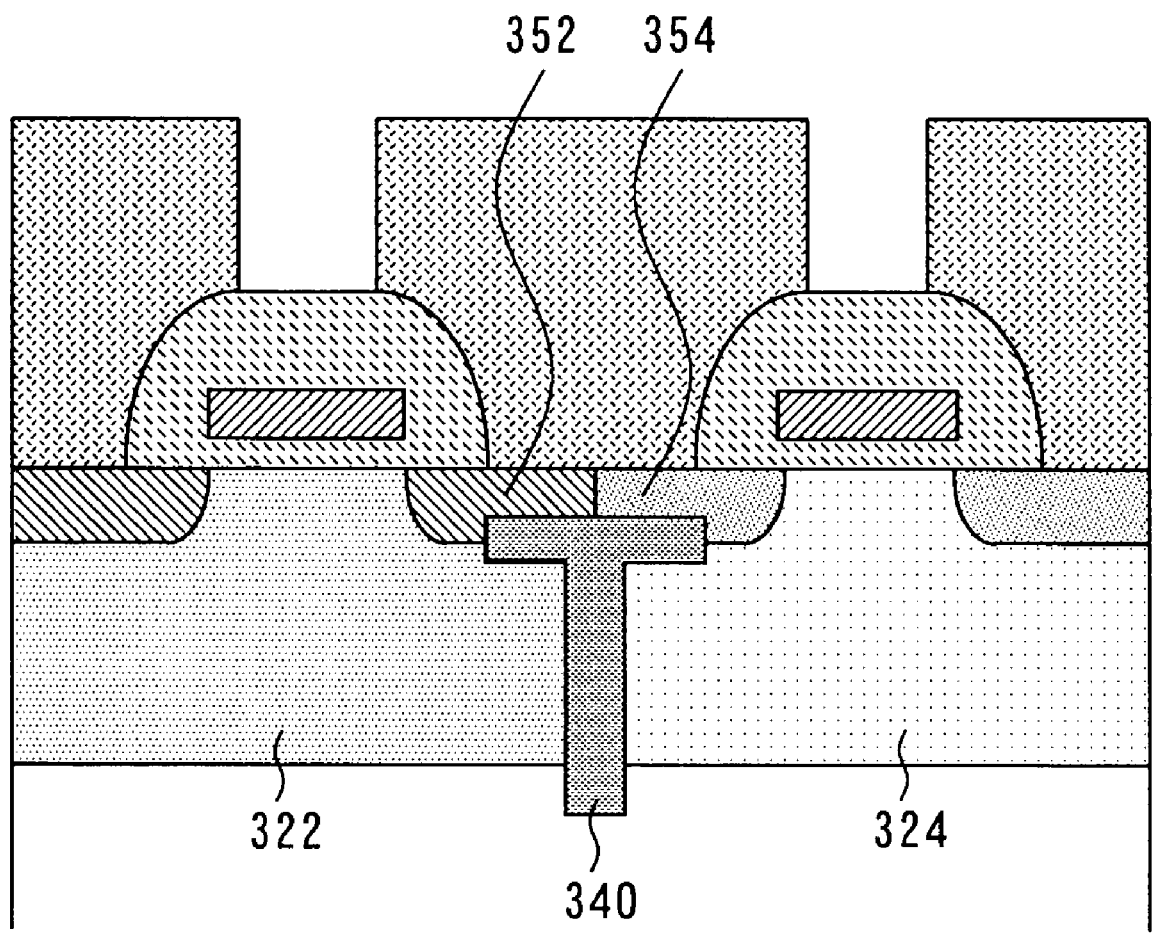
FIG. 27 is shows a T-shaped insulating film.

A CMOS structure such as shown in FIG. 25 preferably has sufficient resistance to latch-up due to the formation of a parasitic device. Therefore, to prevent such latch-up, the semiconductor device includes an insulating film 356 formed immediately under a drain 352 of the NMOS structure 350 and a drain 354 of the PMOS structure 351, as shown in FIG. 26. It should be noted that the semiconductor device may include the T-shaped insulating film 340 shown in FIG. 27 to separate the P-well region 322 and the N-well region 324 from each other in order to more effectively prevent latch-up. Preventing latch-up using insulating films in the manner described above results in reduced size of the chip.

Fifth Embodiment

Figure 28:
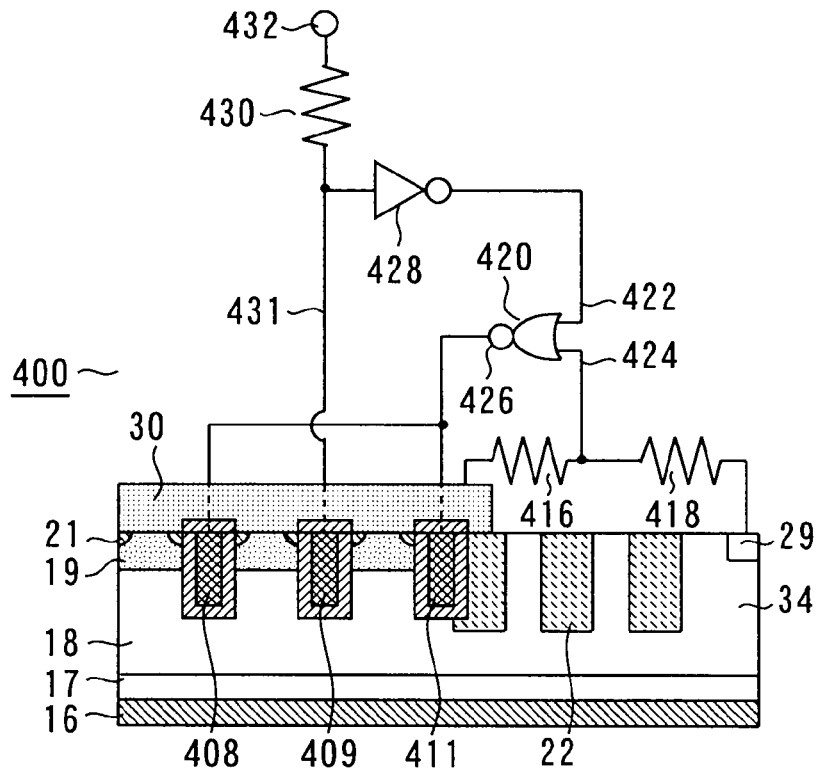
FIG. 28 shows a semiconductor device according to fifth embodiment.

A fifth embodiment of the present invention relates to a semiconductor device with short circuit protection capability in which specific gate electrodes receive a gate drive signal only when the device is in its normal on state. The configuration of this semiconductor device will be described with reference to FIG. 28. This semiconductor device includes a power device with guard rings which is similar to the IGBT described in connection with the first embodiment. Only so much of this semiconductor device will be described as is necessary for an understanding of its features as compared to those of the semiconductor device of the first embodiment. Referring to FIG. 28, a gate electrode 409 is connected to one end of a gate resistance 430 by a gate wire 431, and the other end of the gate resistance 430 is connected to a gate terminal 432. Gate electrodes 408 and 411, on the other hand, are connected to the gate terminal 432 through a NOT circuit 428 and a NOR circuit 420.

The NOR circuit 420 receives the output of the NOT circuit 428 and also receives a voltage derived from the voltage of the peripheral portion 34 via a resistance element 418. More specifically, the NOR circuit 420 outputs a gate drive signal to the gate electrodes 408 and 411 if both the output of the NOT circuit and the voltage derived from the voltage of the peripheral portion 34 are at a low level (0), i.e., if the semiconductor power device is turned on and the collector voltage Vce is low (i.e., lower than when the load circuit is short circuited).

That is, a gate drive signal for turning on the power device is applied to the gate electrodes 408 and 411 only when the gate drive signal supplied from the gate terminal 432 is at a high level (i.e., high enough to turn on the power device) and the collector voltage Vce is low enough to indicate that the power device is in its normal on state. Therefore, for example, a gate drive signal for turning on the power device is not applied to the gate electrodes 408 and 411 when the power device is turned off or when the load circuit connected to the device is short circuited. The above means for supplying a gate drive signal to particular electrodes only when specific conditions are met is hereinafter referred to as "gate drive signal supply means."

Thus this gate drive signal supply means does not apply a gate drive signal (for turning on the power device) to the gate electrodes 408 and 411 when the collector voltage Vce is high even if the device is in its on state. This means that a gate drive signal is not applied to the gate electrodes 408 and 411 if the load circuit connected to the device is short circuited, thus enhancing the short circuit capability of the semiconductor device 400. On the other hand, a gate drive signal for turning on the power device is applied to the gate electrodes 408 and 411 when the collector voltage Vce is low, i.e., when the device is in its normal on state, thereby reducing the device resistance and hence the steady state loss of the semiconductor device 400 in its on state. It will be noted that the resistance elements 416 and 418 may be connected to the guard rings 22 in such a manner as to enhance the dielectric strength of the semiconductor device, as described above.

Figure 29:
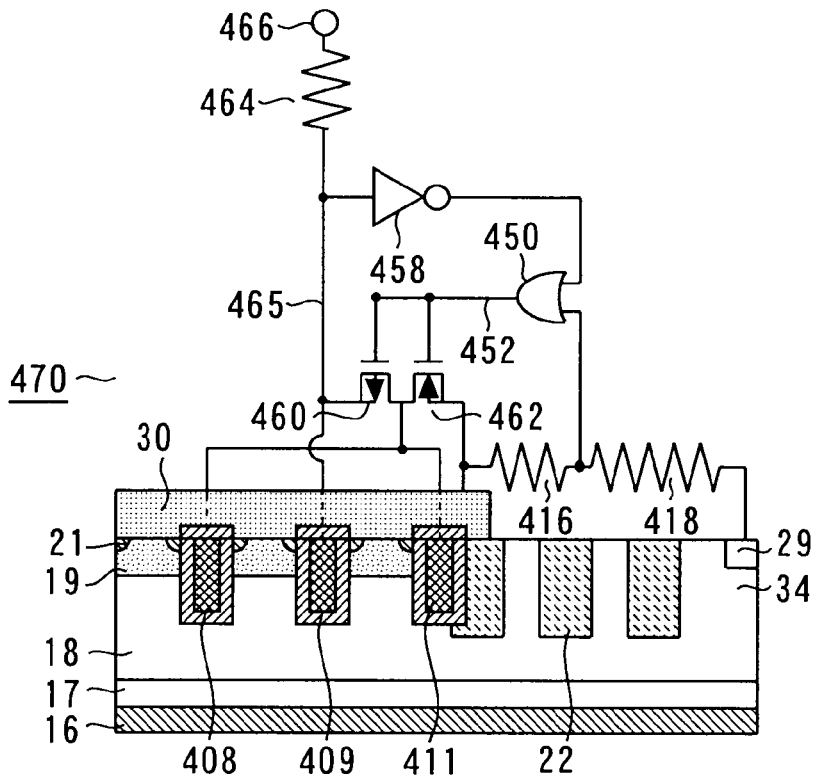
FIG. 29 shows a semiconductor device including an OR circuit, PMOS transistor, and NMOS transistor.

The present embodiment is characterized in that it includes two types of gate electrodes: one to which a gate drive signal is applied to turn on the device; and the other to which a gate drive signal is applied only when the device is in its normal on state. Therefore, various alterations may be made to the above-described semiconductor device without departing the scope of the present invention. For example, the semiconductor device may include an OR circuit 450, a PMOS transistor 460, and an NMOS transistor 462, instead of the NOR circuit 420, as shown in FIG. 29. The OR circuit 450 receives the output of the NOT circuit 428 and also receives a voltage derived from the voltage of the peripheral portion 34. The PMOS transistor 460 is turned on when the output of the OR circuit 450 is at a low level (0). The NMOS transistor 462 is turned on when the output of the OR circuit is at a high level (1), thereby grounding a gate wire 465. This arrangement has the same advantages as described above in connection with the present invention.

Thus the present invention enables semiconductor devices to have enhanced performance.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-291327, filed on Nov. 13, 2008 including specification, claims, drawings and summary, on which the Convention priority of the present application is based, are incorporated herein by reference in its entirety.

What is claimed is:

1. A semiconductor device comprising:
    a semiconductor substrate including a semiconductor layer;
    a power device formed in said semiconductor substrate;
    a plurality of concentric guard rings formed in said semiconductor substrate and surrounding said power device; and
    voltage applying means for applying successively higher voltages respectively to said plurality of concentric guard rings, with the outermost concentric guard ring having the highest voltage applied thereto, wherein:
    said power device includes a grounded emitter electrode formed on a top surface of said semiconductor substrate, a gate electrode formed in said top surface of said semiconductor substrate, and a collector electrode formed on a bottom surface of said semiconductor substrate, said bottom surface being opposite said top surface;
    said voltage applying means includes a plurality of series-connected resistance elements connected between said semiconductor layer and said emitter electrode; and
    said plurality of concentric guard rings are connected to different successive ones of said plurality of series-connected resistance elements, with the outermost concentric guard ring being connected to the one of said successive series-connected resistance elements closest to said semiconductor layer.

2. The semiconductor device as claimed in claim 1, wherein each of said plurality of concentric guard rings is connected to a respective one of said plurality of series-connected resistance elements by a capacitor.

3. The semiconductor device as claimed in claim 1, wherein said plurality of series-connected resistance elements are connected to a peripheral portion of said semiconductor layer outside of said plurality of concentric guard rings.

4. The semiconductor device as claimed in claim 3, wherein said plurality of series-connected resistance elements are made of polysilicon and together form a spiral extending over said plurality of concentric guard rings.

5. The semiconductor device as claimed in claim 3, wherein said plurality of series-connected resistance elements are made of polysilicon and together form a straight line extending over said plurality of concentric guard rings.

6. The semiconductor device as claimed in claim 3, wherein said plurality of series-connected resistance elements are made of polysilicon and together form a zigzag line extending over said plurality of concentric guard rings.

7. The semiconductor device as claimed in claim 1, wherein said plurality of series-connected resistance elements include a plurality of series-connected diodes connected at a cathode thereof to said semiconductor layer and at an anode thereof to said emitter electrode.

* * * * *